United States Patent [19]
Nagle et al.

[11] Patent Number: 5,793,648
[45] Date of Patent: Aug. 11, 1998

US005793648A

[54] METHOD AND SYSTEM FOR AUTOMATING CONTROL PANEL LAYOUT AND WIRING SPECIFICATIONS FOR A VEHICLE MANUFACTURING PROCESS

[75] Inventors: Kevin Dale Nagle, Portland, Oreg.;
David H. Wixom, Vancouver, Wash.;
David J. Phillips, Vancouver, Wash.;
Marlon D. Gorden, Vancouver, Wash.;
Joe Richard Wee, Milwaukie, Oreg.;
Steven A. Wright, Charlotte, N.C.

[73] Assignee: Freightliner Corporation, Portland, Oreg.

[21] Appl. No.: 724,730

[22] Filed: Sep. 30, 1996

[51] Int. Cl.[6] .................................................. G06T 17/40
[52] U.S. Cl. ............................. 364/512; 364/474.24
[58] Field of Search ........................... 364/512, 505, 364/474.24, 474.13, 474.25, 468.01, 578

[56] References Cited

U.S. PATENT DOCUMENTS

| | | | |
|---|---|---|---|
| 4,870,594 | 9/1989 | Ohkawara et al. | 364/474.24 |
| 5,440,849 | 8/1995 | Agrawal et al. | 52/393 |
| 5,591,528 | 1/1997 | Fisher et al. | 428/411.1 |
| 5,671,338 | 9/1997 | Araki et al. | 395/51 |

OTHER PUBLICATIONS

Declaration of Applicant (Kevin Dale Nagle).

*Primary Examiner*—Kevin J. Teska
*Assistant Examiner*—Matthew Clay Loppnow
*Attorney, Agent, or Firm*—Klarquist Sparkman Campbell Leigh and Whinston LLP

[57] ABSTRACT

A method and system for automatically generating panel layout and wiring harness specifications for vehicles. The panel layout system receives as input a list of parts including switches, gauges, connectors, circuit breakers, etc., and automatically places these parts in a control panel (e.g. dash panel or electrical panel) within the vehicle. To place these parts automatically, the system extracts potential panel locations for each part from a database, and then attempts to place the parts in their corresponding potential panel locations. The system can also generate a wiring specification for the vehicle. Once panel locations are assigned, the system attempts to assign circuits in the wiring harness to electrical contact locations associated with panel locations.

19 Claims, 15 Drawing Sheets

METHOD AND SYSTEM FOR AUTOMATING CONTROL PANEL LAYOUT AND WIRING SPECIFICATIONS FOR A VEHICLE MANUFACTURING PROCESS

FIELD OF THE INVENTION

The invention relates to vehicle manufacturing processes and more specifically relates to automated design specification for vehicle manufacturing.

BACKGROUND OF THE INVENTION

The electrical instrumentation in cars and trucks is becomingly increasingly more complex. With advances in the electronic systems in vehicles, the dash, door and even ceiling panels have become more cluttered with a variety of instruments and gauges used to monitor vehicle performance and control operating conditions within the cabin and throughout the vehicle. This is especially true of today's long haul trucks, which have all of the typical instruments such as the fuel gauge, speedometer, tachometer, etc. as well as additional controls and indicators for anti-lock brake systems, fuel economy indicators, collision detection systems, parking brake controls, automated transmissions, etc.

These additional controls add to the complexity of the electrical wiring in the vehicle. The instrumentation in the cabin as well as other electrical parts throughout the vehicle are typically connected together using wiring harnesses. When electrical controls are added or moved in the vehicle, the wiring harnesses have to be designed to connect these controls with other components such as circuit breakers and power supplies.

The complexity of the instrumentation and wiring in vehicles makes it expensive and time consuming to design the layout of and document the electrical controls and their wiring throughout the vehicle. If each vehicle were manufactured in the same way, the engineering effort needed to design and document control panel layouts and electrical wiring would not need to be duplicated for each vehicle. However, this would substantially limit the customer's ability to select the instrumentation and panel layout for a vehicle.

If a customer wants a particular type of electrical system on his or her vehicle(s), it is sometimes necessary to add related electrical controls in the cabin and wiring throughout the vehicle to support it. In addition, if a customer would like to position dash gauges and switches to his or her specifications, the dash panel and related wiring have to be custom engineered to satisfy this request. Obviously, the added engineering time needed to customize the panel design can add significantly to the complexity and cost of the manufacturing process.

In addition to the engineering time needed to customize instrumentation in a vehicle, it also requires additional time and expense to document a custom vehicle design so that the documentation can be sent to manufacturing plants or vendors and archived for future use.

There is a need, therefore, for improved methods and systems for generating panel layout and wiring specifications for vehicles.

SUMMARY OF THE INVENTION

The invention provides an automated system and method for generating panel layout specifications for vehicles. The system described below is particularly designed for long haul trucks, but it can be adapted for a variety of different types of vehicles. One version of the system automates the process of creating specifications for wiring harnesses as well as panel layouts throughout a vehicle.

The method for automating a panel layout specification generally includes reading a list of parts ordered for a new vehicle and then automatically locating selected parts in the control panels of the vehicle. These control panels can include, for example, instrumentation panels in the cabin or electrical panels throughout the vehicle. The system can generate panel layout specifications, which describes the panel locations for the selected parts in each vehicle, without requiring a user to enter panel location data for each vehicle. In instances where the system cannot find a panel location for a part, it reports this to the user. The user can add or change existing panel location data. When the user adds or modifies the data, the system updates itself and reuses this information for subsequent vehicles without requiring the user to enter the panel location data again.

In one specific implementation, the panel layout system selects electrical components for a vehicle and extracts panel location data for each of these parts. This data includes the part's priority and potential panel locations for the part. The system sorts the panel location data and then finds panel locations for each part. If a potential panel location for a part is already occupied by another, higher priority part, the system attempts to place the part in another potential panel location. After successfully placing each of the components, the system can generate a panel layout specification to send to a manufacturing plant or to vendors that make and assemble the panels based on the specification.

There are a number of variations and enhancements to the panel location system. One enhancement is a method for automatically generating a wiring harness specification for each vehicle. The method of generating a wiring specification, in one implementation, includes extracting wiring harness data for each wiring harness item listed on the vehicle being processed and then assigning the wires in each harness to electrical contact locations on the control panels in the vehicle. The wiring assignment process assigns floating circuits to pinout locations by determining the panel location of each panel item and then attempting to assign the floating circuit to a pinout location that corresponds to that panel location. This implementation of the system allows circuits to "float" based on the panel location of the part to which they are to be electrically connected, and also based on particular pinouts available in a given panel assembly.

When implemented with the features summarized here, the panel layout and harness wiring processes have a number of advantages over conventional approaches to generating vehicle specifications. One advantage is the significant savings in engineering time created by automating the panel layout and harness wiring specification process for vehicles. A related advantage is that it simplifies the process of generating a manufacturing specification for custom panel layouts. Unlike many vehicle manufacturing processes, the location of instrumentation in the dash and other panels in the vehicle can vary from vehicle to vehicle, even for the same vehicle model. Once the user has entered potential panel locations for parts on a particular vehicle model, these locations do not have to be entered again. The system can re-use this information over and over to generate panel layouts automatically for subsequent vehicles.

The automated process for generating wiring harness specifications provides a number of advantages as well. Since the vehicle panel layouts vary from vehicle to vehicle, the wiring specifications can also vary. In addition, the specific electrical contacts within each part may also vary. The wiring assignment process summarized above automatically generates a design specification for wiring harnesses.

Both the panel layout and wiring harness processes generate a specification that can be transmitted electronically to vendors or to the manufacturing plant. In addition, the specification can be archived for each vehicle for future use in manufacturing or repair.

Further features and advantages of the invention will become apparent with reference to the following detailed description and accompanying drawings.

DETAILED DESCRIPTION

Figure 1:
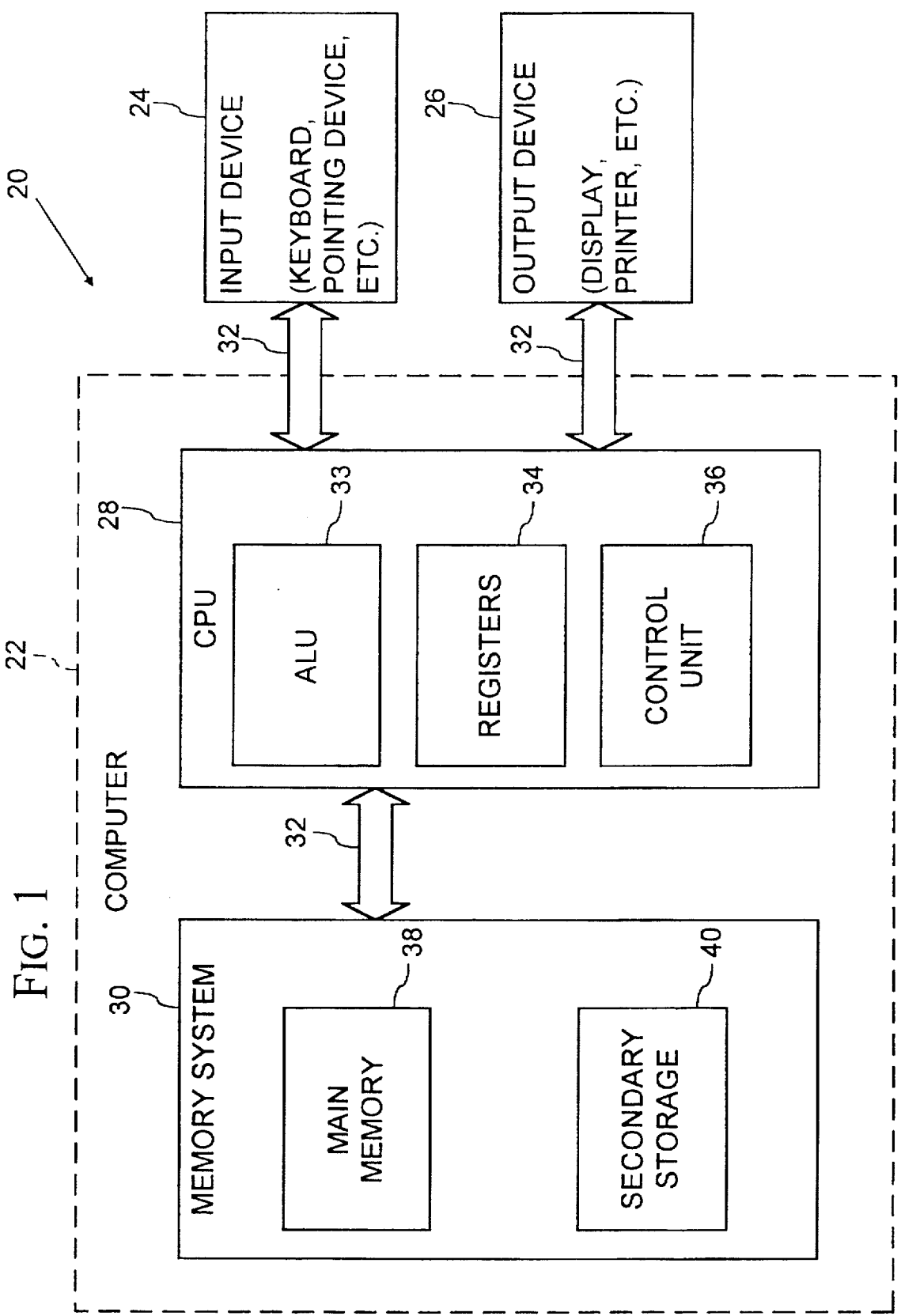
FIG. 1 is a general block diagram of a computer system in which the invention can be implemented.

FIG. 1 is a general block diagram of a computer system 20 in which the invention can be implemented. The computer system 20 includes as its basic elements a computer 22, one or more input devices 24 and one or more output devices 26 including a display device. A method for automating the design of panel layouts and harness wiring in vehicles can be implemented in the computer shown in FIG. 1 or in a combination of computers connected in a computer network.

Computer 22 generally includes a central processing unit (CPU) 28 and a memory system 30 that communicate through a bus structure 32. CPU 28 includes an arithmetic logic unit (ALU) 33 for performing computations, registers 34 for temporary storage of data and instructions and a control unit 36 for controlling the operation of computer system 20 in response to instructions from a computer program such as an application or an operating system.

Memory system 30 generally includes high-speed main memory 38 in the form of a medium such as random access memory (RAM) and read only memory (ROM) semiconductor devices, and secondary storage 40 in the form of a medium such as floppy disks, hard disks, tape, CD-ROM, etc. or other devices that use optical, magnetic or other recording material. Main memory 38 stores programs such as a computer's operating system and currently running application programs. In some computer display architectures, portions of main memory 38 may also be used for displaying images through a display device.

Below we describe software implementations of the invention. This software can be implemented in a program or programs, each comprising a series of instructions stored on a computer-readable medium. The computer-readable medium can be any of the memory devices, or a combination of the memory devices described above in connection with main memory and secondary storage.

Input device 24 and output device 26 are typically peripheral devices connected by bus structure 32 to computer 22. Input device 24 may be a keyboard, pointing device, pen, joystick, head tracking device or other device for providing input data to the computer.

The output device 26 can include a display device for displaying images on a display screen, a printer, sound device or other device for providing output data from the computer.

It should be understood that FIG. 1 is a block diagram illustrating the basic elements of a computer system; the figure is not intended to illustrate a specific architecture for a computer system 20. For example, no particular bus structure is shown because various bus structures known in the field of computer design may be used to interconnect the elements of the computer system in a number of ways, as desired. CPU 28 may be comprised of a discrete ALU 33, registers 34 and control unit 36 or may be a single device in which one or more of these parts of the CPU are integrated together, such as in a microprocessor. Moreover, the number and arrangement of the elements of the computer system may be varied from what is shown and described in ways known in the computer industry.

One implementation of the invention is a computer-implemented method for automating the design specification for control panels in vehicles. Control panels can include, for example, panels located at the dash (dash panel), ceiling (ceiling panel), or door (door panels) within the cabin of a vehicle. One common example of this type of panel is the control panel at the dash of a vehicle, where switches and gauges such as the speedometer, fuel gauge, AM/FM radio, HVAC controls, etc. are mounted.

In addition to panels in the cabin, control panels can also include electrical panels in the vehicle. An "electrical panel" is a panel for mounting electrical connectors and controls such as pin type connectors, circuit breakers, relays, power supplies, etc. One example of an electrical panel is a power distribution module in a vehicle where circuit breakers and other types of electrical connectors for wiring harnesses are mounted. The power distribution module acts as an interface for connecting wiring harnesses to electrical components, power supplies or ground terminals.

This implementation of the invention is implemented on a mainframe computer from Amdahl Corp. running the MVS operating system from IBM Corp. From the description below, it will become apparent that the invention can be implemented on any of a variety of conventional computer systems running conventional operating systems.

The automated process for generating the design specification of a control panel generally includes determining which parts (e.g., switches, gauges, etc.) the customer has ordered for a vehicle and assigning these parts to panel locations. To assign a part to a panel location, the method attempts to place each part based on its priority. The parts are associated with one or more predefined panel locations.

The panel location method enables the customer to specify a "custom" panel layout. The customer can, for example, specify a desired panel location for switches and gauges in the dash panel. Subject to physical and legal limitations, the user of the panel location system can enter new panel locations and assign existing panel locations to the switches and gauges according to the customer's specifications. If the customer wants to locate a switch or gauge at a particular location in a panel, the user can enter this panel location and possibly other potential panel locations and associate these locations with this particular part. The user can add a new potential panel location to the system and then associate this new location with the part, and the user can also associate predefined panel locations with the part. The user can instruct the system to try certain panel locations first by ranking the potential panel locations for a part in priority order.

There may be physical or legal limitations that prevent the user from assigning potential panel locations to a part as specified by the customer, however. For example, in some cases the part may not fit in the specified location. Also, the customer may request that another gauge be located where the law requires a speedometer be placed. In these circumstances, the user can assign alternative potential panel locations for the part including newly created panel locations or predefined panel locations.

If the customer does not specify a particular location for a part, the placement process attempts to locate the part based on predefined locations already associated with the part.

During the placement process, the method attempts to locate a part at one of its associated potential panel locations. If this location is unavailable, then it tries another location. If none of the locations associated with the part are available, then the system generates a report indicating that a component cannot be placed. The user can then select other potential panel locations or add new potential panel locations and re-execute the placement method.

In addition to generating a design specification for panel layouts, this implementation of the panel layout system can also automatically generate a wiring specification for wiring harnesses in the vehicle. The process of generating a wiring specification generally includes determining how the electrical components mounted to the panels throughout the vehicle will be connected together. The system identifies the wiring harnesses on the vehicle currently being processed and assigns electrical contact locations to the wires in these harnesses. The process of assigning wires to electrical contacts is related to the panel location process since the assignment of electrical contact locations to wires depends on the panel location of a part (e.g., switch, gauge, circuit breaker, etc.) to which the circuit is connected. Since the panel location of parts can vary depending on the outcome of the automated panel location process, the location of electrical contacts on the panel vary as well. In addition, the position of a specific electrical contact within an electrical connector can vary as well.

Figure 2:
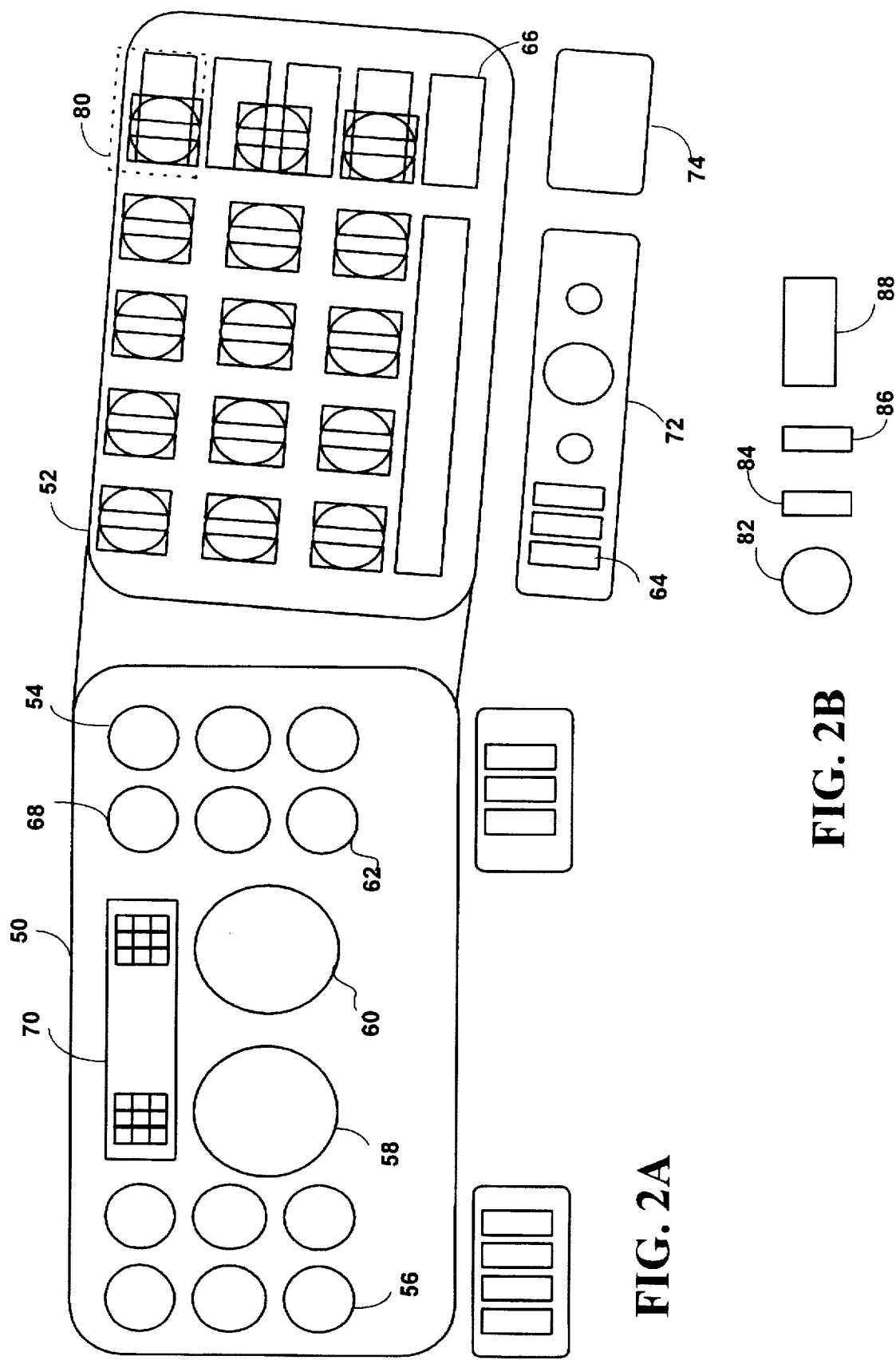
FIG. 2A illustrates an example of a dash panel, including predefined panel locations in that panel.
FIG. 2B shows an exploded view of panel locations in the dash panel that overlap each other.
Figure 3:
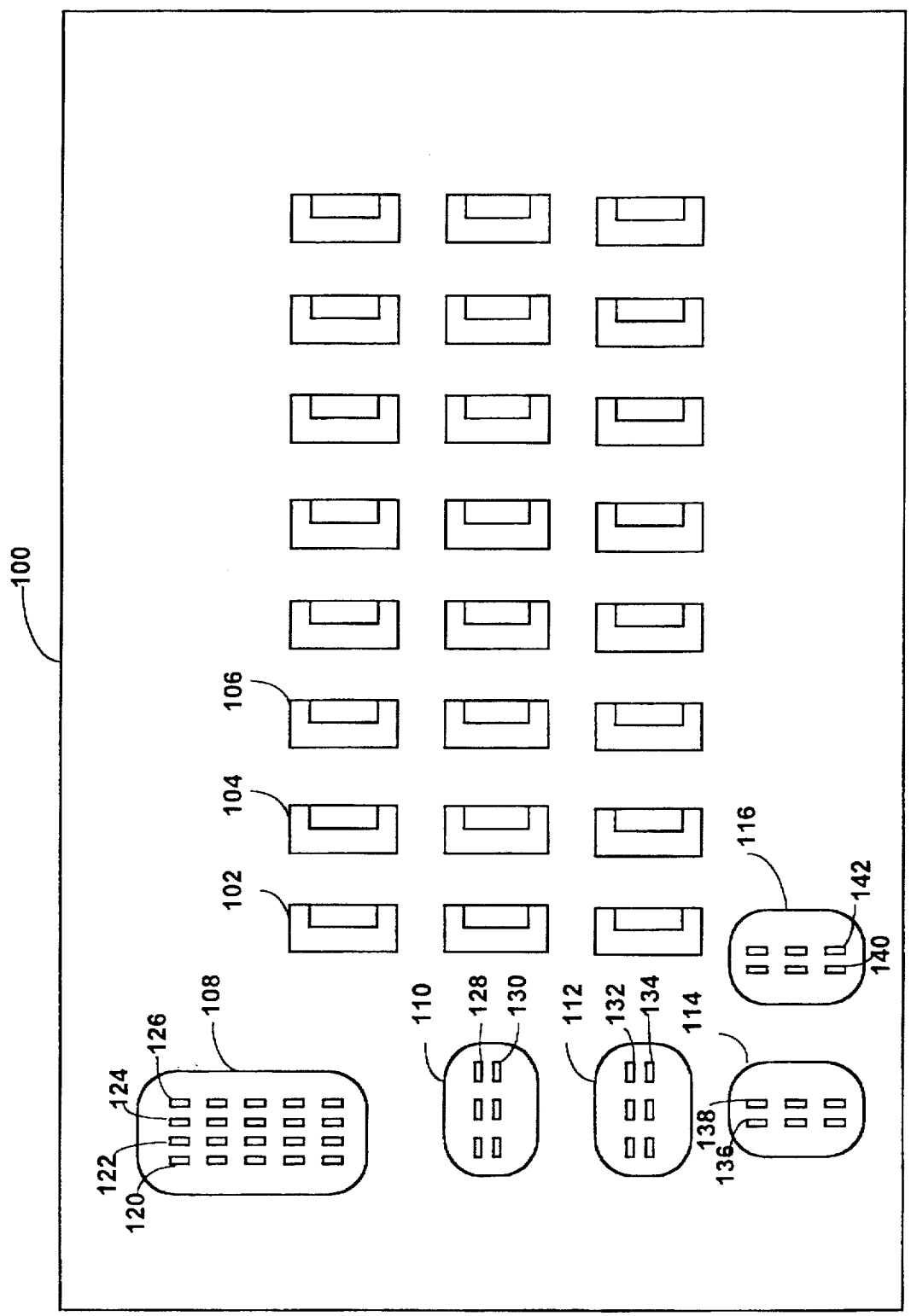
FIG. 3 illustrates an example of an electrical panel in a vehicle.
Figure 4:
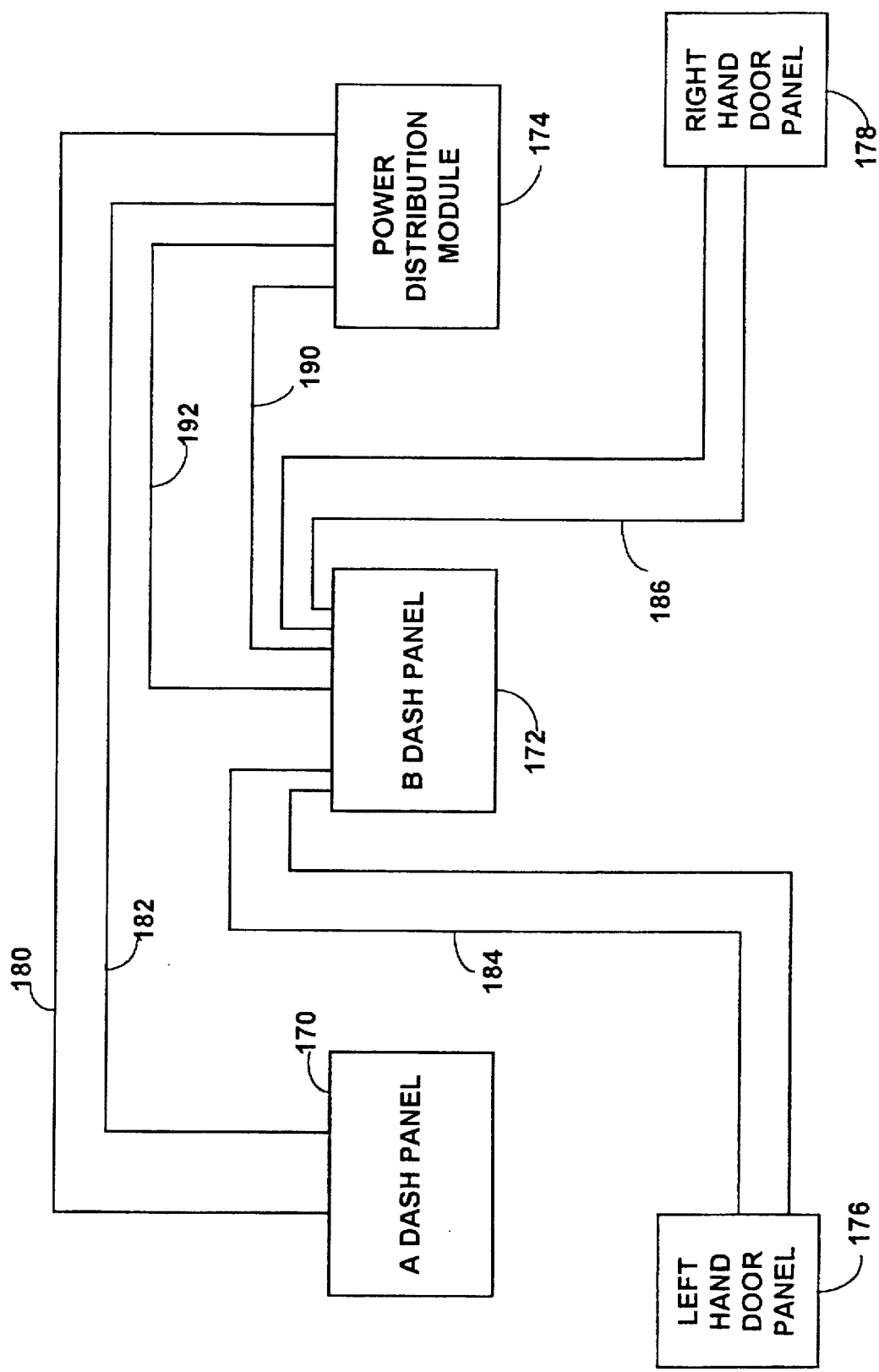
FIG. 4 illustrates an example of electrical wiring among panels in a vehicle.

FIGS. 2–3 provide examples of vehicle panels, and FIG. 4 shows an example of vehicle wiring to help illustrate the process of generating design specifications for panel layouts and wiring harnesses.

FIG. 2A illustrates an example of a dash panel. The example dash panel shown in FIG. 2A includes two primary panel sections: section A 50 on the left side of the dash, and section B 52 on the right side. Each panel section 50, 52 has a variety of predefined part locations (for example, 54–74). A number of different predefined panel locations are illustrated on the dash shown in FIG. 2A by the outline of an area in the panel that can be occupied by a part. Each panel location in the dash panel, for example, represents a potential location for a dash control part such as a fuel gauge, speedometer, light switch, etc.

The outline of these parts can vary in shape, size, and position. Therefore, the panel locations used to mount these parts vary as well. For example, some panel locations have a circular footprint (for example, 54–62), while others have a rectangular footprint (for example, 64 and 66). In some instances, a footprint for one panel location can overlap or "block out" other panel locations.

The panel area delineated by dashed lines 80 in FIG. 2A illustrates an example of panel locations that overlap each other. Each panel location within this dashed line is shown separately in FIG. 2B. As shown in FIG. 2B, this portion of the dash includes four separate panel locations, including a panel location with a circular outline 82, two smaller panel locations having rectangular outline 84, 86, and a fourth location having a larger rectangular outline 88. Each of these panel locations overlap as shown in the portion delineated by the dashed lines in 2A and therefore cannot exist in a single dash layout. If, for example, a gauge is assigned to the panel location 82 with the circular outline, then other parts cannot be assigned to the panel locations (84–88) that it blocks out.

The specific size, shape, and location of predefined panel locations can vary from panel to panel and within a panel itself. In this particular implementation, the user can add panel locations, which may or may not overlap with other predefined panel locations. When a user adds a panel location to a panel, he or she gives the panel a unique identifier, and if the new location overlaps other pre-existing locations, also lists which locations are blocked out by this new location. The placement process uses the list of blocked out locations to keep track of which locations are available as it assigns parts to panel locations.

The size and shape of the panel locations shown in FIG. 2A correspond to the outline or footprint of dash instrumentation such as a switches, gauges or indicator lights. When the system generates a design specification for a panel, it determines how parts are assigned to the available panel locations. For example in this case, the system determines how the switches and gauges on the dash are assigned to the predefined panel locations 54–74 in the dash panel. As it attempts to place components on the dash, it may assign the speedometer to panel location 60, a tachometer to panel location 58, a fuel gauge to panel location 68, etc.

Some panel locations are designed for specific types of components. For instance, panel location 70 is designed for an instrumentation control unit, panel location 72 is usually associated with HVAC controls, and panel location 74 is usually occupied by an AM/FM radio 74. Some vehicles may not have these components, in which case other parts can be assigned to panel locations that overlap the panel locations set aside for them.

A variety of components such as switches or gauges can be assigned to a variety of different panel locations. For example, a circular fuel gauge could be assigned to any of a variety of panel locations with a circular outline (56, 62, or 82 for example) that corresponds to the shape of the fuel gauge. Similarly, a simple switch control with a rectangular shape can be assigned to any number of panel locations with a matching rectangular shape (64, 84).

If a new part having an irregular shape is added to a vehicle, a new panel location or a variety of panel locations can be added to the other predefined panel locations. If a panel location is created and it overlaps other panel locations, the system also stores the panel locations that it overlaps or blocks out. Then, if a part is assigned to this panel location during the placement process, the panel locations it overlaps are no longer available.

FIG. 2A illustrates just one possible example of the types of predefined panel locations that can be defined for one type of vehicle. It is important to emphasize that this example dash control panel illustrates only one example of the layout of predefined panel locations. The size, shape, and manner in which each of the panel locations overlap can vary.

FIG. 3 illustrates another example of a control panel in a vehicle. This particular control panel 100 is an electrical control panel, which includes a variety of panel locations representing circuit breakers 102, 104, 106, and possibly other types of electrical devices such as relays, connectors, power supplies, etc. This electrical panel also includes connectors 108-116 used to connect wires to the electrical devices mounted in the panel. With respect to the panel location process, an electrical panel is similar to the dash panel illustrated above. During the placement process, electrical components are assigned to panel locations in the electrical panel. For example, circuit breakers are assigned to panel locations such as panel locations 102, 104, and 106. Each of the panel locations corresponds to one or more electrical contact locations of the panel such as the pinout locations of the electrical connectors 108-116. Since circuit breakers can be assigned to any of a variety of panel locations, the pinout location or locations associated with a circuit breaker can vary depending on where the system places a circuit breaker in the panel.

The electrical panel in FIG. 3 illustrates an example of how wires in a wiring harness are assigned to specific electrical contacts within an electrical connector. The electrical panel shown here includes a number of pin type connectors 108-116 designed to connect wiring harnesses to the parts mounted in the panel. Each of these pin type connectors 108-116 have an array of cavities (118, for example) corresponding to pinout locations (items 120-142, for example). These pinout locations are specific examples of electrical contacts associated with a panel location. Each of the panel locations (102, 104, 106, etc., for example) are associated with one or more pinout locations in a connector (108-116).

When a wiring specification is generated for the vehicle, wires in a harness are assigned to electrical contact locations based on the location of a part in a panel. One form of these contact locations is a pinout location associated with a panel location. In this particular implementation, the wires or circuits in a harness are assigned to pinout locations. However, this method applies to other types of conventional electrical contacts that serve as connection points for wiring.

FIG. 4 is a block diagram illustrating an example of the wiring among dash, door and electrical panels in a vehicle. The A and B dash panel blocks shown in this diagram correspond to the A and B dash sections shown in FIG. 2A. This example also includes a power distribution module 174 (see FIG. 3 for an example). Finally, FIG. 4 illustrates wiring connections between left hand and right hand door panels 176, 178 and the B dash panel section.

Wiring and specifically wiring harnesses, electrically connect switches and gauges in the panels located in the cabin with an electrical panel in the vehicle such as the power distribution module 174. Each wiring harness typically includes a number of wires used to connect panels together. For the purposes of this description, the wires and harness are sometimes referred to as "circuits."

The wires or "circuits" are connected to parts in a panel at an electrical contact point within a panel or specific panel location. The panel location of this contact can vary based on the layout of the panel to which the given wire is connected to and can also vary within the panel location. For example, the pin type connector 108 shown in FIG. 3 has a panel location in the panel 100, and in addition, has a number of individual contact positions to which a wire or circuit can be connected. In this case, these electrical contact locations are pinout positions (also referred to as pinout locations). The process of designing the layout of a control panel in the vehicle includes determining respective panel locations for instrumentation as well as electrical contact assignments for the wiring in the harnesses.

While it is a simple example, the wiring diagram in FIG. 4 illustrates wiring among a number of panels. Each of the lines interconnecting blocks in the diagram (such as wires 180-192) illustrates wires connecting components in the vehicle. These wires can be grouped together into a harness or several different harnesses. In order to generate a specification for manufacturing the harnesses, the wires in each harness should be assigned to a contact location, possibly including a specific contact location within a connector or control with more than one electrical contact such as a pin type connector with several pinout positions.

Having generally described the process of generating panel layout and wiring specifications, we now describe a computer-implemented method for carrying out these processes in more detail. This method automates the process of assigning panel locations to instrumentation in the vehicle as well as assigning electrical contact locations (e.g. pinout locations) to wiring.

Figure 5:
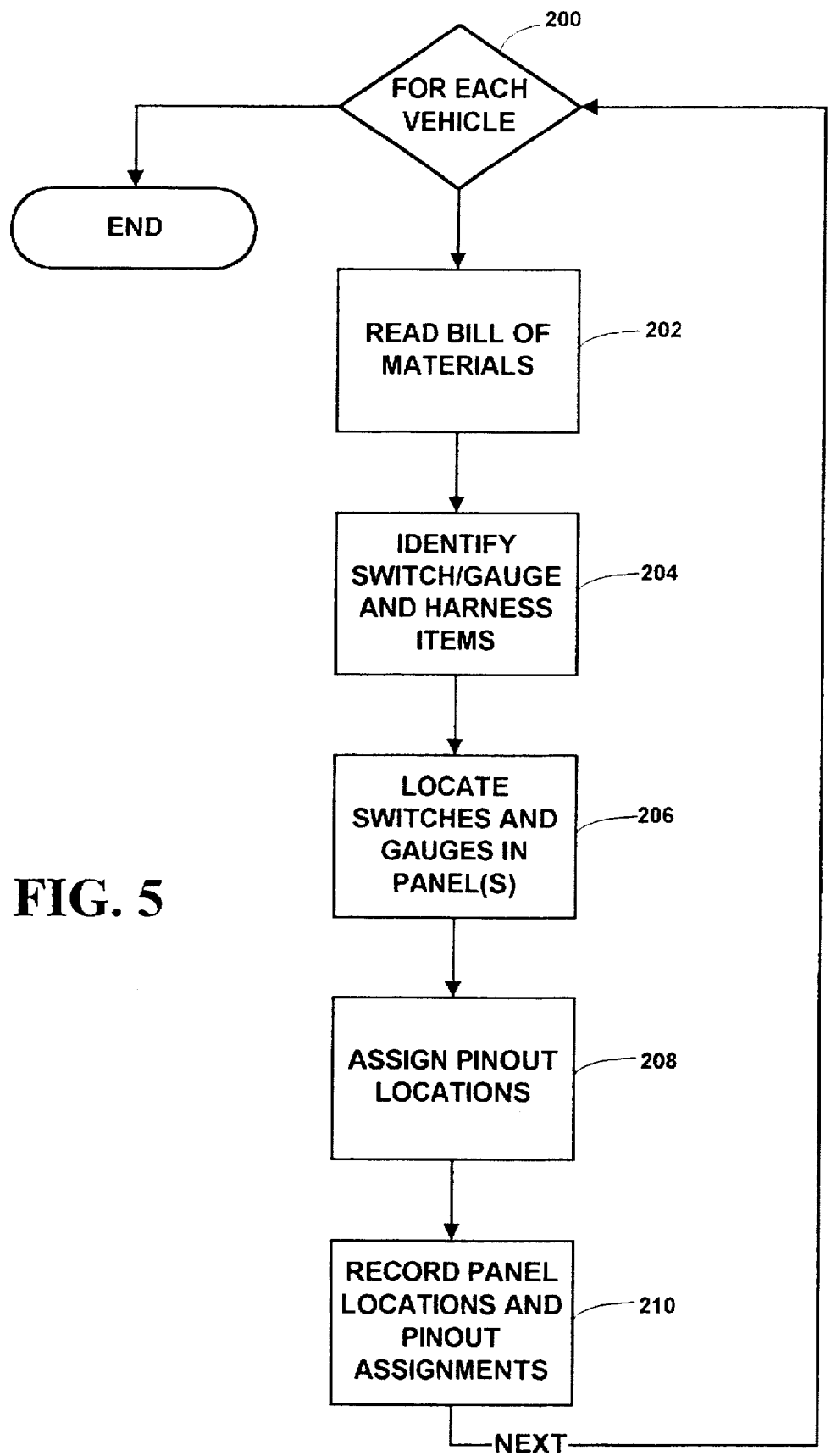
FIG. 5 is a flow diagram generally illustrating processes for generating panel layout and harness wiring specifications for a vehicle.

FIG. 5 is a flow diagram illustrating a method for locating instrumentation and assigning pinout locations for vehicles.

In this particular implementation, a programmed computer system ("system") generates panel location and pinout assignments automatically for individual vehicles. The system can assign panel and pinout locations for a new vehicle having a unique design, and then replicate the resulting panel location and wiring specifications for each vehicle that is identical to that design. Alternatively, the process can be re-executed for each vehicle entering the manufacturing process.

The input to the system comprises a list of parts such as a list of parts typically found on a bill of materials for a vehicle. The automated process of assigning panel and electrical contact locations attempts to convert the list of parts into panel layouts and electrical contact assignments for the vehicle. Once generated, the panel layout and pinout assignments can be used to assemble the vehicle and can also be archived for future reference.

The flow diagram in FIG. 5 of the panel location and pinout assignment process shows how this process is performed for individual vehicles. The flow diagram illustrates how the system repeats the steps in the panel location and pinout assignment process for each vehicle.

The process begins by reading the bill of materials for the vehicle currently being processed (200, 202). In this particular implementation, the process reads through a list of parts in the bill of materials and identifies which of these parts need to be located in a panel (i.e., subject to the panel location process) or assigned to an electrical contact (i.e. subject to the pinout assignment process).

For the purposes of illustration, we refer to parts or instrumentation that need to be located in one of the vehicle panels as a switch and gauge item or simply "switch/gauge" item. We also refer to parts that need to be assigned to a particular electrical contact such as a pinout location as "harness items." In this implementation, switch/gauge and harness items are identified by a part type identifier associated with the parts in the bill of materials. As the system scans through the bill of materials, it identifies switch/gauge and harness items by their part type identifier and places them in one of two lists: a list of switch/gauge items for panel location, or a list of harness items for pin out assignment (204).

In this particular implementation, the process then proceeds to find panel locations for the switch and gauge items in the switch/gauge list. Again, it is important to emphasize that we are using the terms switch and gauge only for the purposes of illustration. The specific types of parts that need to be assigned to panel locations range from instrumentation on the panels within the cabin to electrical connectors and breakers on electrical panels. The specific types of parts subject to the panel location process can vary with each vehicle and with the specific implementation of the system.

The next step shown in the flow diagram FIG. 5 represents the process of assigning the wires in wiring harnesses to electrical contacts, and specifically in this case, pinout locations. This step is shown after the step of locating switches and gauges in this diagram because some pinout assignments can depend upon the panel location of a part to which the wire is connected. Therefore, the process assigns pinout locations after the panel location process has assigned panel locations to the electrical panel items.

When available panel locations and pinout assignments are found for each of the switch/gauge and harness items, these locations and panel assignments are recorded for the vehicle (210). This recorded data can then be sent to the shop floor for manufacturing or to vendors for assembly as part of the process of manufacturing or testing the vehicle.

FIGS. 6–10 are flow diagrams illustrating one implementation of the panel location and pinout assignment processes shown in FIG. 5. In the particular methods shown here, the panel location and pinout assignment processes are implemented using a relational database that has a number of tables to store vehicle model, part, panel location, and wiring harness information.

Figure 11:
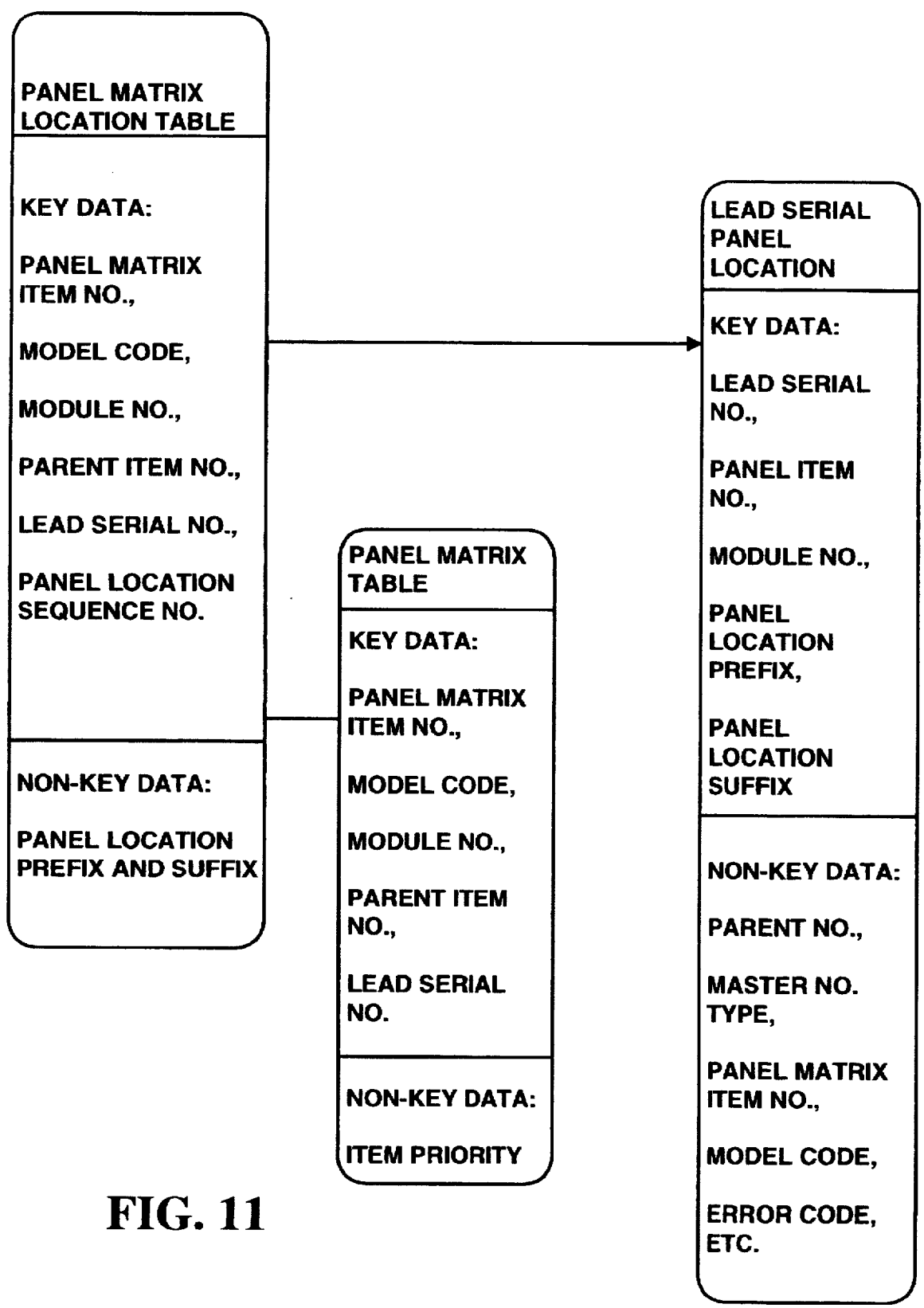
FIG. 11 is a diagram showing the relationship between database tables used to store panel location data in one implementation of the invention.
Figure 12:
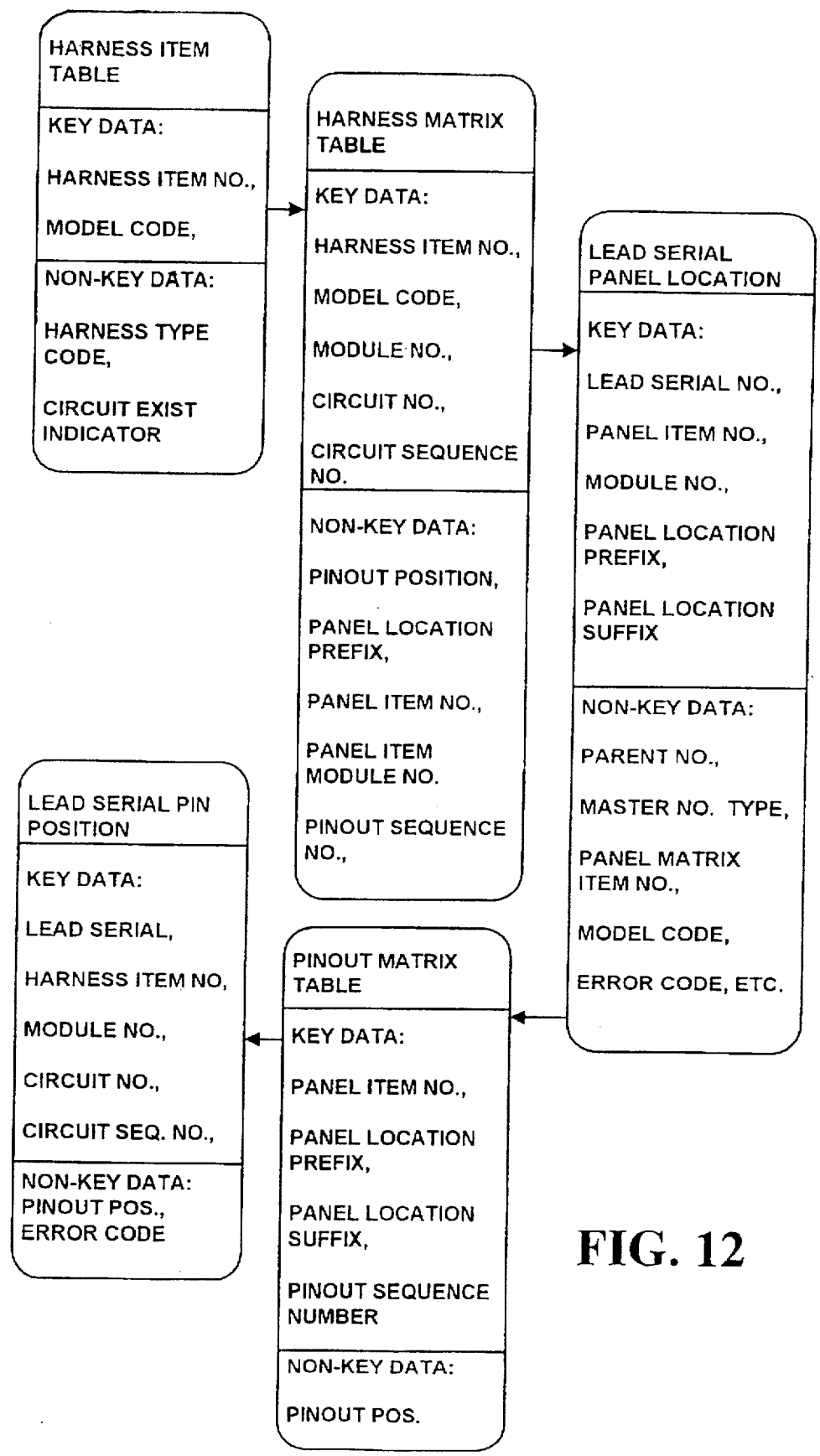
FIG. 12 is a diagram showing the relationship between database tables used to store wiring harness data in one implementation of the invention.
Figure 13:
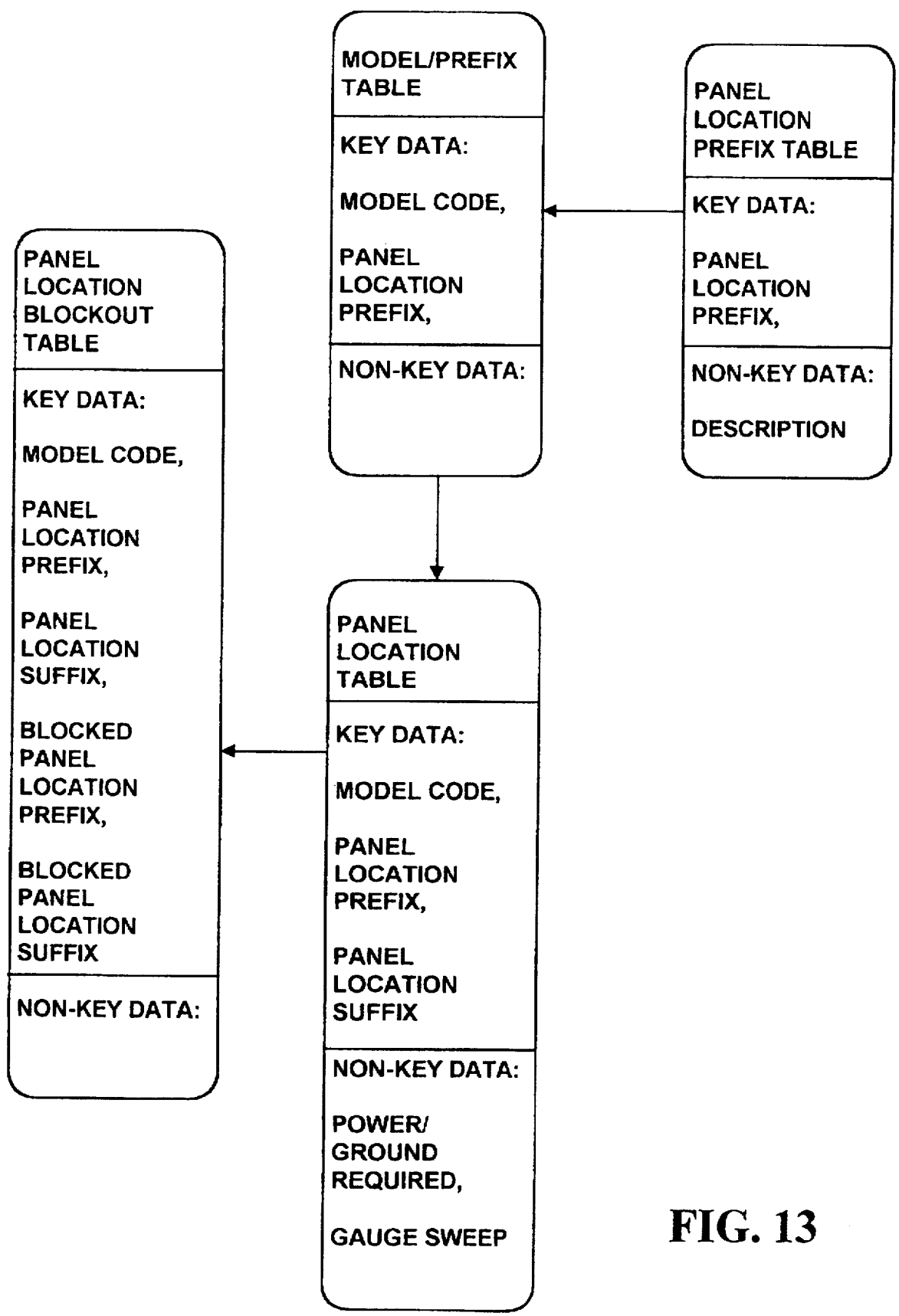
FIG. 13 is another diagram showing the relationship between database tables used to store panel location data in one implementation of the invention.

FIGS. 11, 12 and 13 illustrate tables in the database used to store panel location and harness wiring information. In this particular implementation, these tables are part of a DB2 relational database management system. DB2 is a relational database management program available from IBM Corporation. While the description makes specific reference to a DB2 database and specific types of tables, it is important to note that the invention is not limited to this type of database or the specific examples of the tables provided below. A variety of other relational database systems can be used to implement the invention, the specific table format can vary as well. The description to follow describes how the system uses relational database tables to automatically generate panel location and pinout assignment specifications for vehicles.

Figure 6:
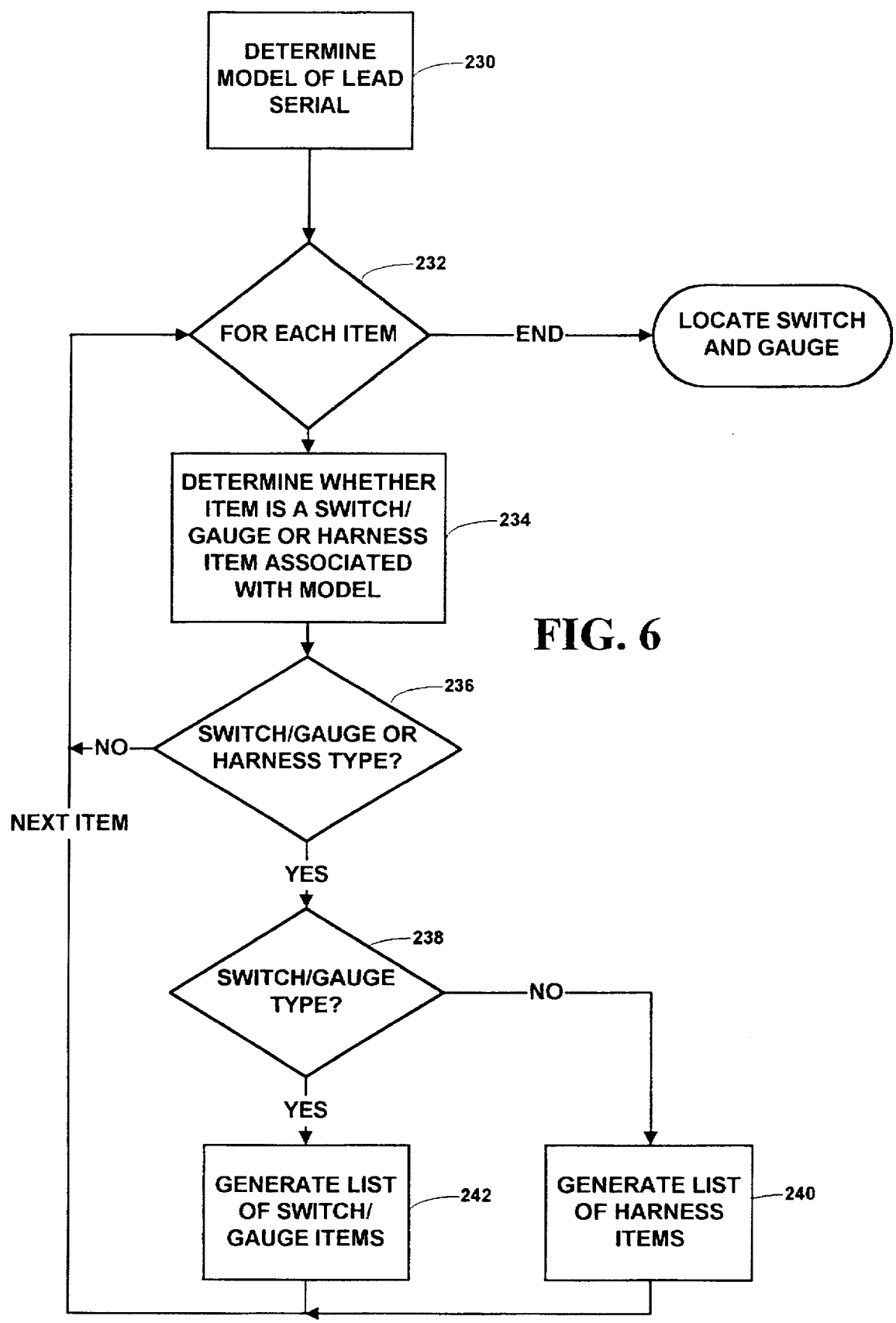
FIG. 6 is a flow diagram illustrating preprocessing steps on vehicle parts list in a process for generating panel layout and wiring harness specifications for a vehicle.

The process shown in FIG. 6 specifically illustrates steps involved in identifying switch/gauge items for panel location and harness items for pinout assignment from a vehicle's bill of materials. Processing for a vehicle begins by determining the model of the "lead vehicle", also known as the "lead serial," for the vehicle (230). To accomplish this, the system looks up a model series code associated with the "lead serial" vehicle in the bill of materials and maps the model series to a model code in a model definition table. The system maintains a model definition table which lists the model codes for different model types. Once it has identified the model of the "lead serial" vehicle, the system uses the model code to identify parts associated with the model of the lead vehicle.

The term "lead vehicle" or "lead serial" refers to the first vehicle in a fleet of vehicles ordered by a customer. Initially, each vehicle in a fleet is usually intended to be the same. However, as trucks in the fleet enter the manufacturing process, changes are sometimes made to the vehicle design. In this particular implementation, each vehicle in the fleet passes through the panel layout and harness wiring processes. This enables changes to be made to the vehicle specification and recorded.

As it processes each vehicle, the system identifies all parts that are subject to the panel layout and harness wiring processes. To accomplish this, the system looks up each part's master number on a master number table associated with the model of the vehicle. As it looks up the parts, the system determines which parts are panel items (i.e., those that are subject to the panel layout process) and which are harness items (i.e., those that are subject to the harness wiring process).

The "model" in this context refers to a model or type of vehicle manufactured by the vehicle manufacturer. In this particular case, for example, the process is applied to the manufacturer of trucks from Freightliner Corporation. Freightliner Corporation manufactures different models of trucks including for example, the Century Class truck, the 1E class truck, and the FLN business class truck.

As the system looks up the parts associated with the vehicle, it checks the type of part to determine whether they should be subjected to the panel location or wiring assignment processes as shown in step 234 in FIG. 6. FIG. 6 uses the term, "item," which is another name for a part in the bill of materials. If an item is neither a switch/gauge item nor a harness item, the system skips it and proceeds to the next item. If the item is a switch/gauge or harness item, the system saves the item and then splits up these items into a list of switch gauge items for panel placement 242 and a list of harness items for the wiring assignment process.

In one specific implementation, the system determines whether a part on the bill of materials is in the model of the lead serial truck by looking up the part's master number on a master number table associated with the lead serial truck. The system extracts all switch/gauge and harness items from the master table, places them in a table, and then searches this table to determine whether a particular part is in the model of the lead serial truck. There are, of course, a number of alternative ways to find whether a part is in the model of the lead serial. For example, the system could look up the master number of a part in the master number table directly.

Ultimately, the output of the process shown in FIG. 6 is a list of switch/gauge items and a list of harness items that serve as input to the panel location and pinout assignment processes.

Figure 7:
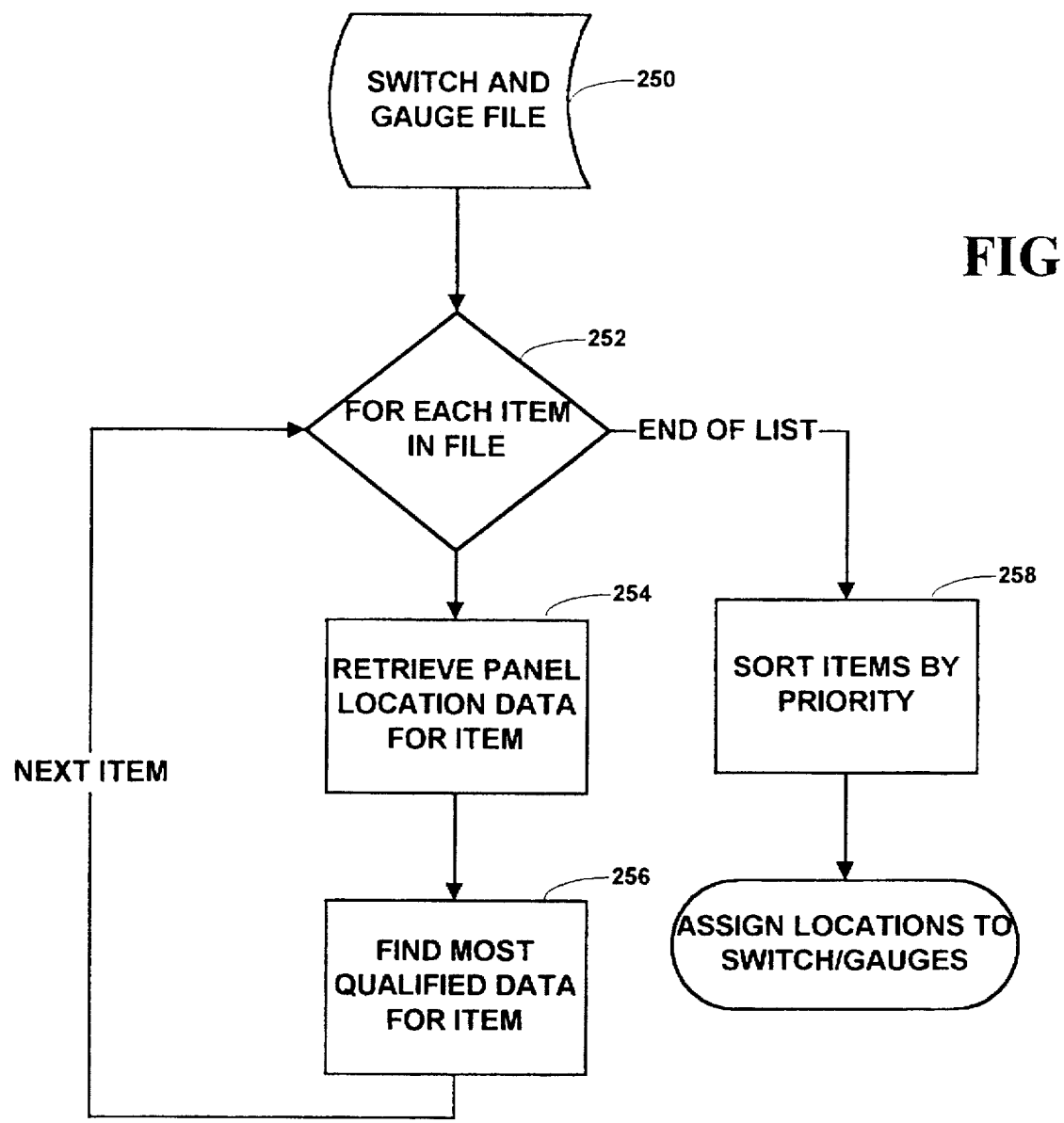
FIG. 7 is a flow diagram illustrating steps for extracting panel location data in one implementation of a process for generating a panel layout specification.

FIG. 7 is a flow diagram illustrating how an implementation of the panel location process retrieves panel location data from the system database. The input to this part of the process is a switch and gauge file (250) including the list of parts generated from the process shown in FIG. 6. The system loops on each item in the switch/gauge list and retrieves the potential panel locations for each item (252, 254).

Specifically in this implementation, the system retrieves the item's priority and potential panel locations of the items, ranked in priority order. The priority of the item is used to control the order in which the system assigns panel locations for items. The priority of panel locations for each item refer to the order in which the system attempts to place the part into one of its corresponding potential panel locations. The system first selects the highest priority panel location, and if it is unavailable, then tries the next highest priority panel location. It continues to attempt to place the part in one of potential panel locations until it finds a panel location for the part or determines that the potential panel locations are not available.

Any given part can be placed in a variety of different locations based on the model, lead serial, etc. Therefore, each part may have a variety of different sets of potential panel locations associated with it. To determine which one of these sets of possible panel location data to use, the system attempts to look up the most qualified panel location data for each item. The system maintains two tables associated with panel location: panel matrix table and the panel matrix location table.

FIG. 11 illustrates the relationships among the panel matrix table, the panel matrix location table, and the panel location table for the lead serial vehicle. Each of the tables include key data and non-key data. The key data provides a "key" or index into the table and represents a searchable field. The arrows connecting the tables represents the relationship between the tables. For example, the records in the panel matrix data refer to one or more records in the panel matrix location table, and the records in the panel matrix location table refer to one or more records in the lead serial panel location table. A panel item in the panel matrix table can have one or more possible panel locations (panel prefix and panel suffix) stored in the panel matrix location table. In this implementation, the panel location is represented by a panel prefix, which identifies the panel in the vehicle, and a panel suffix, which is a number identifying the specific location within that panel. Each of these panel locations has an associated panel location sequence number, which defines the priority order in which the system will attempt to place an item into a panel location.

Each panel location in the panel matrix location table can refer to one or more records in the lead serial panel location table, as reflected by the arrow from the panel matrix location table to the lead serial panel location table.

The tables include a number of fields. Some are self explanatory and others bear further explanation. The module code refers to a vehicle subsystem within a vehicle. For example, if a group of parts are each associated with the HVAC system or the engine, they can be considered part of the HVAC system module or engine module. This is just one way to classify vehicle parts located in the same subsystem. The parent code refers to a bill of materials that the part originates from.

The system looks for the most qualified panel location data for each part (256). The phrase "most qualified" refers to the panel location data that most closely matches the search criteria. One way to qualify panel location data is to rank panel location data in the database based on similarities with the vehicle currently being processed. For example, the system can be programmed to search for panel location data that matches the lead serial, module, or parent item for the part currently being processed.

One example of the specific search criteria is set forth below:

1. Item+Model+Parent Item+Lead Serial
2. Item+Model+Module+Lead Serial
3. Item+Model+Lead Serial
4. Item+Model+Parent Item
5. Item+Model+Module
6. Item+Model Using this search criteria, the system follows this sequence to find the most qualified data for an item. In each case, the system searches for panel location data with a matching item number and model code. In other words, the panel location data extracted from the database must have the same item number of the item being processed and have the same model code of the vehicle being processed. Some data may be more qualified if it includes additional matching criteria. For example, the most qualified data has a matching parent item and a matching lead serial number; the next most qualified data has a matching module and lead serial number, the next most qualified has a matching lead serial number, etc.

After finding the most qualified panel data for an item, the system proceeds to process the next item. The system repeats the step of retrieving and identifying the most qualified data for each item until in completes this step for each item in the file (252).

Next, the system sorts the panel location data by priority (258). To accomplish this, it uses the item priority that it retrieved from the panel matrix table. By assigning a priority to each item, the system can determine the order in which it will attempt to place each item on a vehicle into one of its potential panel locations. Once the items are sorted, the system is ready to begin placing them into panel locations.

Figure 8:
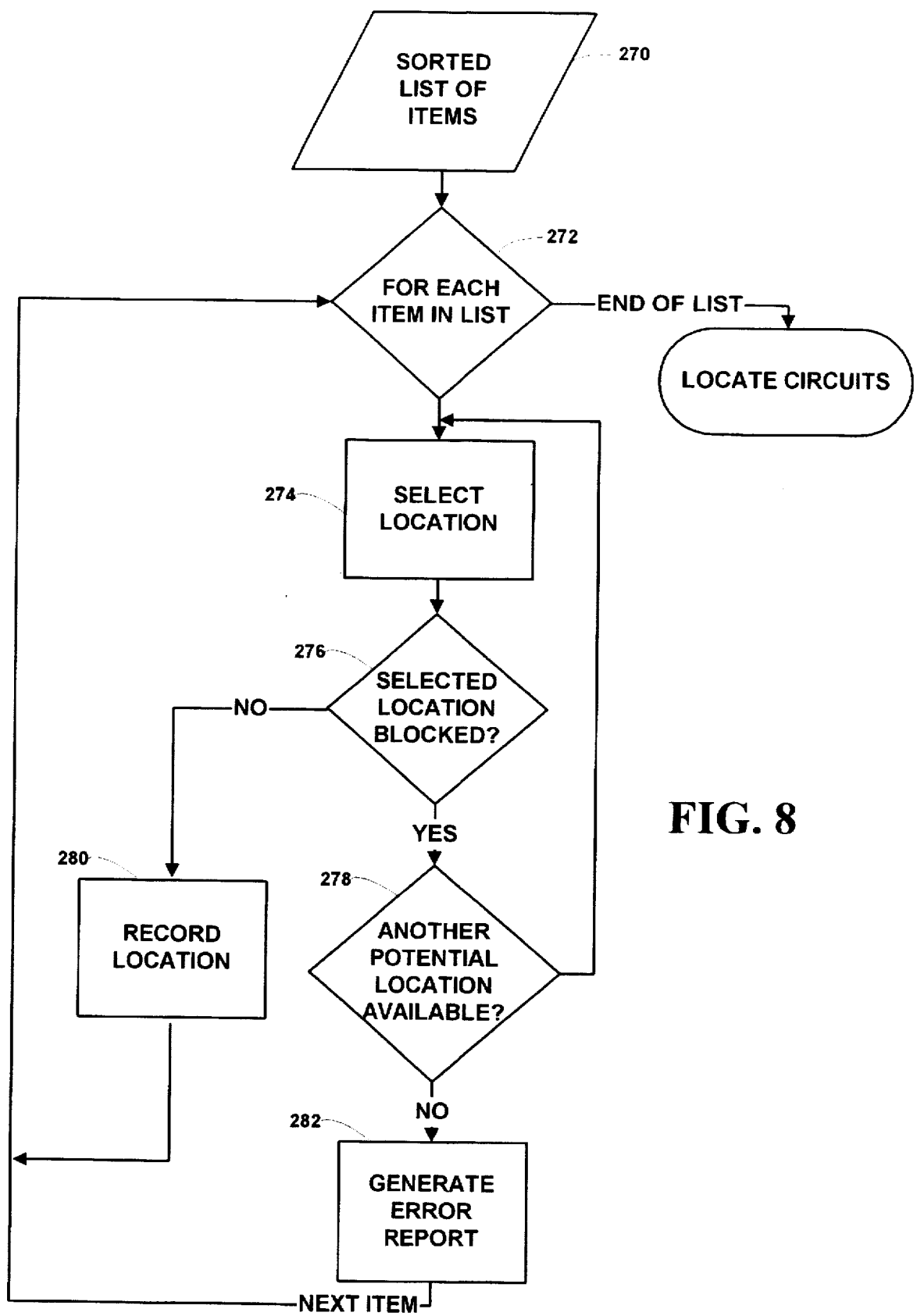
FIG. 8 is a flow diagram illustrating steps for locating parts in panel locations in one implementation of a process for generating a panel layout specification.

FIG. 8 is a flow diagram illustrating how the system places items in the sorted list into panel locations in this implementation. The input to this process is a sorted list of switch/gauge items (270). In this part of the panel locate process, the system loops on each item in the list as shown by the decision block 272 in FIG. 8 and attempts to place the current component into a panel location. The system selects the first potential panel location associated with the item (274) and then checks whether the location is blocked (276). If the location is blocked, the system continues by selecting the next potential location associated with the item (278).

If the system finds that one of the potential panel locations is available, it records the location for the item (280) in the lead serial panel location table and then proceeds to the next item in the list. In the event that none of the potential locations are available, the system records an error in the lead serial panel location table (282).

The error code means either that none of the potential panel locations are available for the item or each panel location in the panel is already occupied. In this implementation, the system reports all of the errors generated from the panel locate process after it has attempted to located each part. The user can correct the first type of error by assigning a new potential panel location or panel locations to the item and then re-starting the panel locate process. For the second type of error, the user can add a new panel location to the database and then associate this new location with the item.

Figure 9:
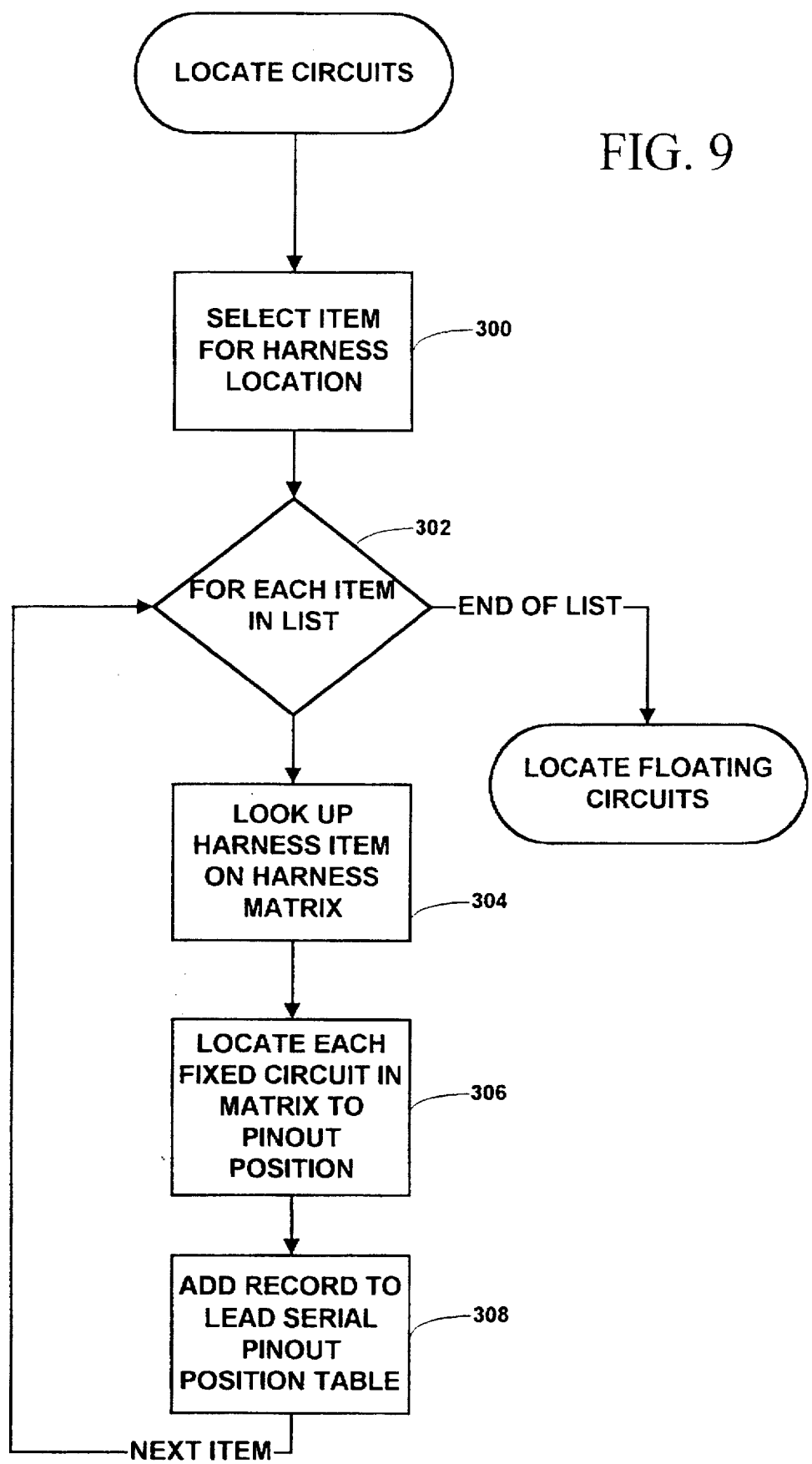
FIG. 9 is a flow diagram illustrating steps for assigning circuits to pinout positions in one implementation of a process for generating a wiring harness specification for a vehicle.

FIG. 9 is a flow diagram illustrating a process for assigning electrical contacts to wires in a vehicle's wiring harness. In the context of this description, a wire in a wiring harness is also referred to as a circuit. The process of "locating a circuit" involves assigning a pinout location to a circuit in a wiring harness. While we specifically describe this process in the context of assigning wires or "circuits" to pinout locations, the process can be applied to other types of electrical contacts as well.

The process of locating a circuit begins by selecting a harness item for processing. As noted above, the system performs a number of preprocessing steps for each vehicle entering the documentation process including identifying those parts that are subject to the wiring assignment process. For example, the preprocessing shown in FIG. 6 and described above includes generating a list of harness items for the wiring assignment process. The system then uses this list as input to the harness wiring assignment process for the vehicle.

One by one, the system selects items from the harness item list (300) and proceeds to assign pinout locations for the wires in each harness. The items in this list correspond to wiring harnesses, which usually include at least two wires (circuits). In this implementation, there are two types of circuits: fixed circuits, and floating circuits. Fixed circuits are circuits in a harness that are fixed to a specific pinout position. Floating circuits, on the other hand, can "float" among different pinout locations associated with a panel location. A circuit can be considered to float because the panel location of the electrical part to which it is connected can float and depends on the outcome of the panel location process. For instance, a circuit can float because it is connected to a circuit breaker whose panel location can float among a number of potential panel locations.

Figure 10A:
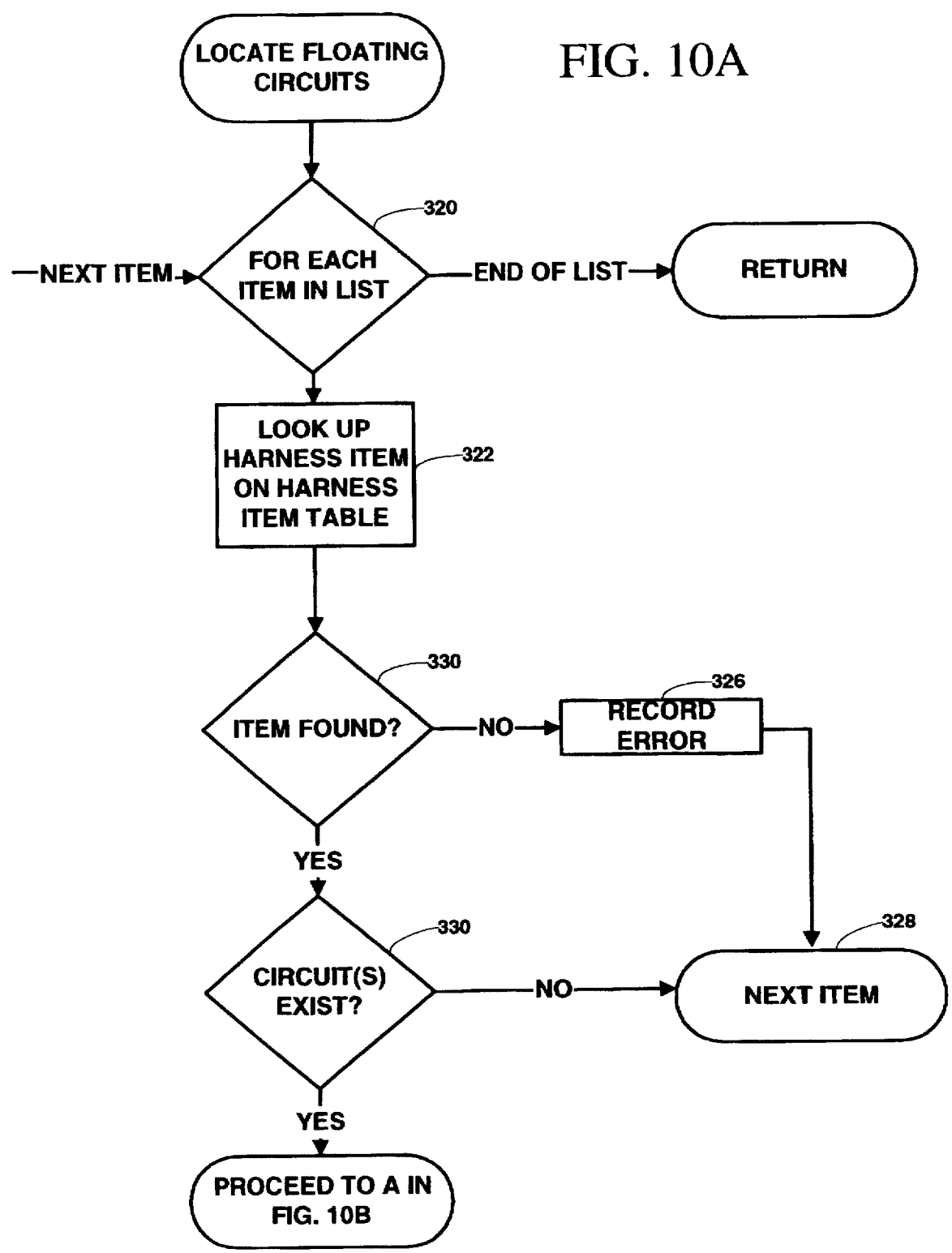
FIGS. 10A–C are flow diagrams illustrating steps for assigning floating circuits to pinout positions in one implementation of a process for generating a wiring harness specification for a vehicle.
Figure 10B:
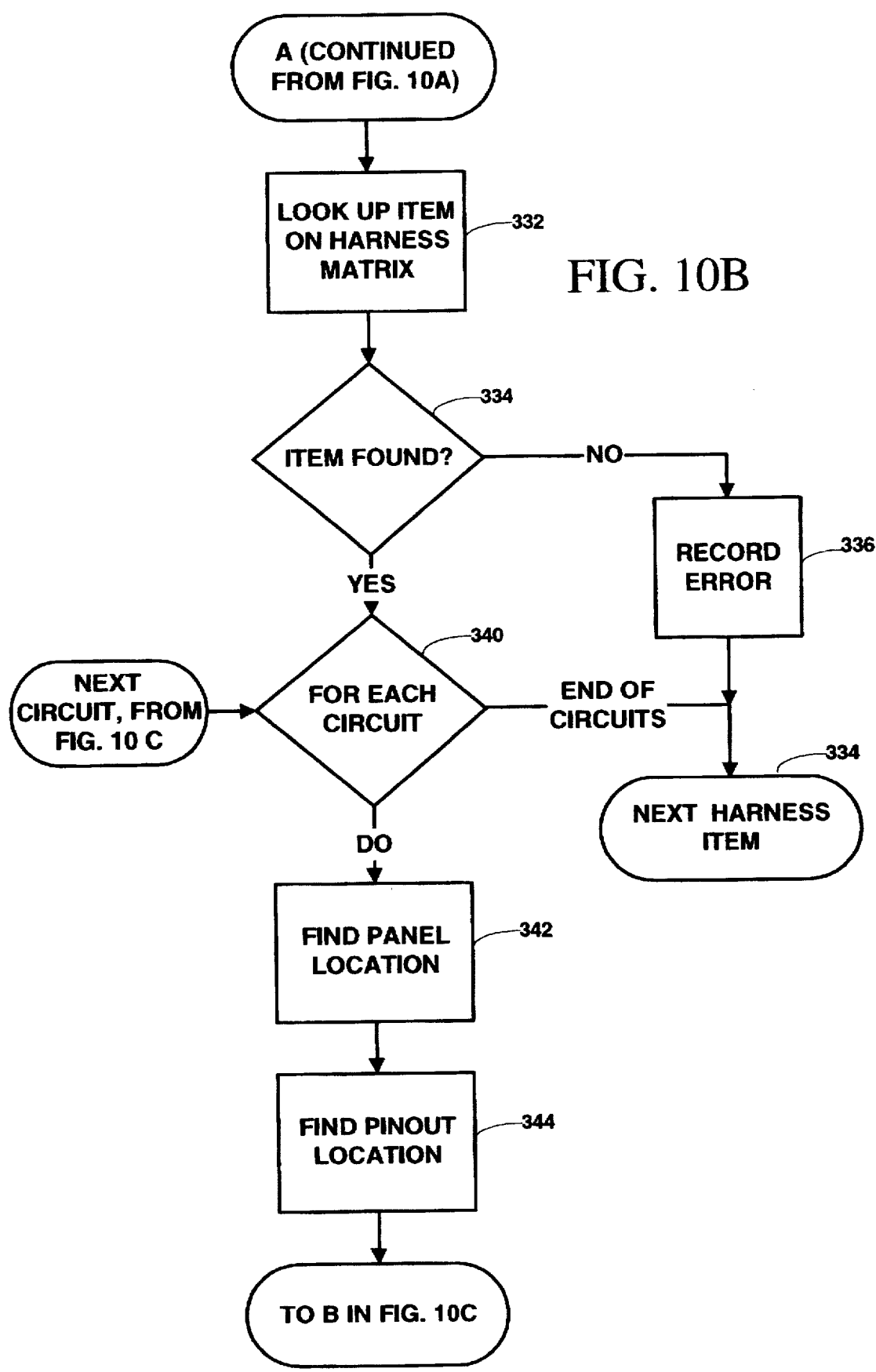
Figure 10C:
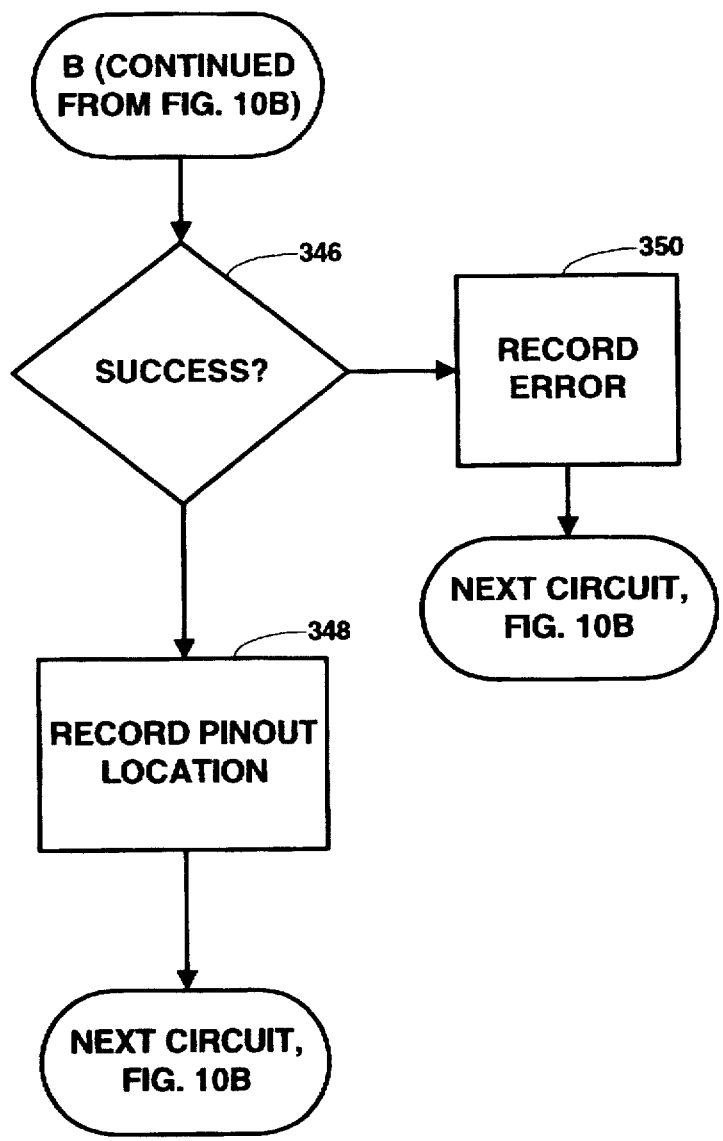

Starting at decision block (302), FIG. 9 illustrates how the system assigns pinout locations to fixed circuits. FIGS. 10A–C, which are described further below, illustrate how the system assigns pinout locations to harness items with floating circuits. In this particular implementation, the system assigns pinout locations to fixed circuits first and then proceeds to assign locations to floating circuits.

To locate a fixed circuit, the system looks up the harness item currently being processed in a harness matrix table (304). The harness matrix table includes a number of harness items and corresponding circuit(s) associated with the each harness item. The harness matrix also provides pinout positions for fixed circuits in the matrix.

FIG. 12 illustrates the relationship among harness and pinout tables used in this implementation of the wiring assignment process. These tables include a harness item table, a harness matrix table, the lead serial panel location table, a pinout matrix table, and the lead serial pinout position table. Each of the arrows between the tables show the relationship between tables. For example, a record in the harness item table (representing a wiring harness) may refer to one or more records in the harness matrix table (each representing a circuit in the wiring harness).

In the wiring assignment process of FIG. 9, the system looks up a harness item using its harness item number in the harness item table. A harness item can have 0 or more fixed circuits associated with it in the harness matrix table. The system assigns each of these fixed circuits into the pinout position specified for it in the harness matrix table (306). It then proceeds to add a record to a lead serial pinout position table (308). The lead serial pinout position table keeps track of the pinout positions for the circuits in each harness item in the lead serial vehicle.

FIGS. 10A–C illustrate how the system assigns pinout locations to floating circuits. The first part of the process of assigning pinout locations to floating circuits parallels the process for fixed circuits. The system iteratively processes harness items in the list of harness items generated in the preprocessing phase. For harness items in the list (320), the system looks up the item in a harness item table using the harness item number to find the item in the table (322).

If the system cannot find the item number in the harness item table, it generates an error report (324, 326). The error report indicates to the user that the harness item needs to be added to the harness database for the model of the vehicle currently being processed. After recording the error, the system proceeds to process the next item in the list (328).

If the system finds the item in the harness item table, it checks whether it includes circuits (whether any circuits exist for this harness) (330). The harness item table in this embodiment includes a "circuits exist indicator" field which indicates whether the harness item has circuits that require pinout assignments. If it does, the system proceeds to look up the harness item in the harness item matrix as shown in FIG. 10B (332). If no circuits exist, however, the system simply proceeds to the next item in the list of harness items extracted during the preprocessing phase shown in FIG. 6.

As shown in FIG. 10B, the system proceeds to assign the circuit(s) for the current harness item if it can find the harness item in the harness matrix table. This is the same table as described above in connection with FIG. 9. If it does not find the harness item (334), the system records an error (336) and proceeds to the next item (338).

When it finds the harness item in the harness matrix table, the system iteratively processes the floating circuits for the current harness item (340). For each floating circuit, the system finds the panel location of floating circuit (342).

In this implementation, the panel location is represented by a panel location prefix and panel location suffix. The system finds the panel location prefix by looking up the prefix in the harness matrix table using the harness item number and circuit number as a key into the table.

In addition to the panel prefix, the system looks up the panel item number associated with the floating circuit and the pinout sequence number in the harness matrix table. The panel item number is the number of the part where the circuit is connected, and the pinout sequence number identifies a pinout position in cases where a panel location has more than one pinout position associated with it.

Once it has the panel prefix, the system can look up the panel location for the floating circuit in the lead serial panel location table using the panel prefix as a key into the table (342). Using this key, the system finds a panel location (panel prefix+panel suffix) in the panel location table of the lead serial vehicle.

The panel location table for the lead serial stores panel location data generated for the lead serial during the panel locate process. It keeps track of the panel locations for parts mounted on panels throughout the vehicle. For example, if a floating circuit is connected to a circuit breaker in an electrical panel, the lead serial panel location table records the panel location of this circuit breaker. To determine where the panel location process placed a given part, the system looks up the panel location of the part (e.g., circuit breaker) to which the circuit is attached.

Once it has found the panel location, the system then finds the pinout location for the circuit at this panel location (344). In this implementation, the system begins by determining the type of panel associated with the circuit currently being processed. The type of panel is identified in a harness matrix table through the panel location prefix. For example, a panel location prefix of PD corresponds to a power distribution panel and the prefix BH corresponds to a bulkhead panel. The system then determines the part number for this type of panel in the vehicle. It does so by looking up the panel prefix (along with a suffix of 000) in the lead serial panel location table (see FIG. 12) to determine what the part number is for the panel of this type in this vehicle. Once it has identified the specific panel used in the vehicle, the system can then determine the panel locations associated with that particular panel as well as the pinout locations associated with those panel locations.

Within this specific implementation, there are two ways to make pinout assignments at this point. If there is no specific part associated with the current circuit in the harness matrix table, then the system looks up the first panel location in this panel that a switch gauge item (e.g., circuit breaker) has been placed into during the panel layout process. The system then looks up a pinout position in the pinout matrix table (See FIG. 12, for example) using this first panel location found in the lead serial panel location table and the pinout sequence number from the harness matrix table as a key. The pinout sequence number identifies the specific pinout position to assign to the current floating circuit being processed.

If there is a specific part number associated with the circuit in the harness matrix table, the system attempts to assign this circuit to a pinout location based on where the panel layout process located this specific part in the panel. As described in the previous paragraph, the system first identifies the specific panel and then looks up the panel location of the part in the lead serial panel location table using the part number as a key into the lead serial panel location table. The system then looks up the pinout position for the circuit in the pinout matrix table using the panel location of the part and the sequence number as a key (See FIG. 12 for an example of the relationship between the pinout matrix table and lead serial panel location table).

If the system is successful in finding a pinout position for the floating circuit (346, FIG. 10C), it records a new record in a pinout position table for the lead serial vehicle (348, FIG. 10C). This table, illustrated in FIG. 12 as the lead serial pin position table, stores the pinout assignments for the lead serial vehicle. If the system is unable to locate a pinout position for a floating circuit, it records an error code in this table (350), and later, reports this error to the user.

The system includes a number of different programs that enable the user to view panel location and harness data on a display monitor as well as update this data in the system database. When invoked on the computer, these programs act as the user interface to the panel locate and wiring assignment system. They control the display of information from the database, prompt the user for input, and use this input to change or add panel or harness data to the database. Below we describe the display screens in the user interface and explain how they are used to display or modify information in the database.

One screen, called the master number inquiry/update display, enables the user to add, change, delete and display master numbers for parts (switches, gauges, harnesses, for example) on a master number table. When the user invokes the routine associated with this screen, the system displays fields for the model code, master number type (e.g., dash type, electrical type, or harness type), and locate process (apply panel locate or wiring assignment process).

Another screen, called the model inquiry/update, enables the user to add, change, delete and display valid model codes in the system's model and model definition tables used in a variety of tables in the system database. As noted above, these model codes define the model of a vehicle.

Another screen, called the panel location by model inquiry, enables the user to display all panel locations by the model from a panel location table. The panel location table maintains a list of panel locations by model code. This display screen includes fields to show panel locations including panel prefixes and suffixes for a given model. The user can jump to another screen, called the panel location inquiry/update, by invoking the routine to this other screen on one of the displayed panel locations.

The panel location inquiry/update screen enables the user to add, change, delete, and display valid panel locations used in the panel matrix location table (see FIG. 11 for an example of this table). To add a panel location, the user specifies the panel location and each model that this panel location can be used on. The user can also specify the panel locations blocked out by a given panel location. The panel locations entered by the user (or automatically by the system) are stored in a panel location table.

FIG. 13 illustrates the relationship between database tables used to store panel location information in one implementation of the system. These tables include the panel location table referred to above, as well as a panel location blockout table, model/prefix table, and panel location prefix table. The panel location prefix table keeps track of valid panel location prefixes. If the user tries to add a panel location with a new prefix, the system prompts the user to add the prefix first and specify the models it can be used on. Once a prefix is added in this manner, the user can add panel locations for that prefix.

In addition to the panel location, the user can specify additional information about a new panel location at the panel location inquiry update screen. As shown in FIG. 13, the panel location table can store information about the panel location including whether a power or ground is required, and the sweep of a gauge (90 or 270 degrees). Records in the panel location table can also refer to one or more records in the panel blockout table, which stores the panel locations blocked out by a panel location.

Another screen, called the panel matrix inquiry/update, is used to add, change, delete, and display data from the panel matrix and panel matrix location tables for items to be located in a panel.

A screen called the pinout matrix inquiry/update can be used to add, change, delete and display pinout positions in the pinout location table (see FIG. 12) by panel item number. In this implementation, each panel location specified in the pinout matrix table can have up to 8 pinout positions associated with it. The wiring assignment process described above uses these pinout positions associated with a panel location in the lead serial panel location table to assign floating circuits to pinout positions.

Another screen supported in this system is called the harness matrix inquiry/update screen. This screen is used to add, change, delete and display information used to assign fixed and floating circuits to pinout positions. One implementation of this screen includes a number of fields including: 1) circuits exist, circuit number, pinout positions for fixed circuits, and panel location prefix for floating circuits. Additional fields for floating circuits include electrical component item number, circuit breaker module number, panel location sequence number and pinout sequence number.

The system adds data entered into the circuits exist field to the harness item table (see FIG. 12, for example). This indicates whether the harness has one or more circuits associated with it in the harness matrix table. The circuit number, which forms part of a record in the harness matrix table, associates a number with each fixed and floating circuit in a harness.

For fixed circuits, the user specifies a pinout position using this screen.

For floating circuits, the user specifies the type of panel to which the circuit will be connected and possibly other data. In this implementation, the type of panel is identified by the panel location prefix (e.g., PD for a power distribution module, BH for a bulkhead panel, etc.) The additional data provided by the user can include the item and module number of a part (such as a circuit breaker) to which the circuit is to be connected. It can also include a panel location sequence number, which is used by the wiring assignment process in cases where a circuit is going to be assigned using the panel location of a part, and there are more than one of these parts in the relevant module. In these cases, the panel location sequence number specifies to the wiring assignment process which of the parts of this type to connect to the circuit.

Finally, another field in this screen, called the pinout sequence number, enables the user to enter the number of a pinout position for panel locations that have more than one pinout position. The system adds this information to the harness matrix table as shown in FIG. 12., and the wiring assignment process uses this number to determine which pinout position within a panel location should be assigned to a circuit.

In addition to the display screens described above, the system can also display or print panel location and wiring harness information for a series of vehicles or for individual vehicles. The system includes a routine to display or print a list of vehicles that have panel location or wiring assignment errors associated with them. This implementation displays (and can also print) the types of errors (panel location or wiring harness errors) by vehicle identification number.

The user can display or print panel location or wiring assignments for a vehicle. For panel location information, the system can either print or display the panel location data for the vehicle by looking up the vehicle's serial number in the lead serial panel location table and retrieving all panel location data associated with that vehicle. The lead serial panel location table includes any error codes that the panel location process recorded (see the error codes in the non-key data of the lead serial panel location table of FIGS. 11 and 12).

For harness information, the system can either print or display the harness data for the vehicle by looking up the vehicle's serial number in the lead serial pin position table and retrieving all wiring information for that vehicle. The lead serial pinout position table includes error codes that the wiring assignment process recorded (see the error codes in the non-key data of the lead serial pinout position table of FIG. 12).

The system described above automatically generates an error report for vehicles that have passed through the panel location and wiring assignment processes. Errors for the panel location process include panel matrix not found, which means that panel location data does not exist for the item listed, and location not available, which indicates the potential panel locations for the item are blocked out or used by another item or items. The user can correct the first problem by adding a matrix entry for the item, and the second problem by, for example, updating the potential panel locations for the item, or changing the panel location for items blocking out this item. This method for error reporting and correction applies to panels within the cabin as well as electrical panels in the vehicle.

Errors for the wiring assignment process can include: harness item matrix not found, which indicates that data does not exist for the item on the harness item/matrix tables; pinout position not available, which indicates that the pinout position listed for a fixed circuit or the pinout position found for a floating circuit is used by another circuit; panel item not found, which indicates that the type of panel corresponding to the specified panel prefix could not be found; circuit breaker panel location not found, which indicates that a panel location could not be found for the part specified in the harness matrix table (This is the part this circuit is to be connected to); pinout position not found, which indicates that a pinout position was not found in the pinout matrix table for a panel location; and circuit breaker panel location not found (nth location), which is the same error as circuit breaker panel location not found, except that this error refers to the case where there are multiple instances of the circuit breaker part and the wiring assignment process cannot find the specified nth instance of this part.

To correct these errors, the user can use the harness matrix update screen, and possibly other screens listed above, to add or update harness data or panel location data so that the error is eliminated in the next iteration of the wiring assignment process.

When the panel locate and wiring harness processes execute without errors, the panel layout and wiring harness specifications generated as a result of these processes are ready to send to manufacturing or vendors. The panel and harness data for the lead serial can be transmitted electronically to the manufacturing plant and or vendors. This data for a particular vehicle can be archived by the vehicle's identification number. Any changes made to the panel location and wiring harness database are available for generating specifications for other vehicles, and need not be re-entered for subsequent vehicles.

In view of the many possible embodiments to which the principles of our invention may be applied, it should be recognized that the illustrated embodiment is only a preferred example of the invention and should not be taken as a limitation on the scope of the invention. Rather, the scope of the invention is defined by the following claims. We therefore claim as our invention all that comes within the scope and spirit of these claims.

We claim:

1. A computer implemented method for generating a control panel layout design for a vehicle panel comprising:

displaying a user interface which enables a user to specify potential panel locations;

in response to input from the user specifying the potential panel locations, updating a panel location database for storing the potential panel locations;

reading a part list including a plurality of parts for a vehicle;

for each part in the list, automatically extracting panel location data including a part priority, a plurality of potential panel locations and associated panel location priorities corresponding to each part from the panel location database;

automatically determining a panel location for each part in order of the priority of each part including attempting to locate a current part at a first panel location of the corresponding potential panel locations for the current part, and if the first panel location is occupied, attempting to locate the current part at a second panel location of the corresponding panel locations for the part, and automatically repeating the attempts to locate the current part until a panel location is assigned or it is determined that none of the potential panel locations are available; and generating a panel layout design for the vehicle including a list of parts and corresponding panel location for each part.

2. The method of claim 1 wherein the part list comprises a list of switches or gauges for a dash of a vehicle and the panel locations refer to footprints for the switches or gauges on the dash.

3. The method of claim 1 wherein the part list comprises a list of electrical controls or connectors for an electrical panel in the vehicle.

4. The method of claim 3 wherein the part list comprises a list of switches or gauges for instrument control panels in the vehicle and electrical connectors for an electrical panel in the vehicle.

5. The method of claim 1 wherein the panel layout includes at least one connector for connecting parts in the part list to a wiring harness, and the connector includes a plurality of electrical contacts; and wherein the method further includes automatically assigning wires in the wiring harness to the electrical contacts of the connector.

6. The method of claim 1 further including:

displaying a user interface which enables a user to specify a part and corresponding potential panel locations for the part; and in response to input from the user specifying a part and corresponding potential panel locations, recording the part and the corresponding potential panel locations in a panel location table; and repetitively using the potential panel locations for the part to automatically locate the part in subsequent designs of panel layouts without requiring the user to re-enter panel location data for the part.

7. The method of claim 1 wherein at least a subset of the panel locations are associated with electrical contact locations for connecting circuits in a wiring harness to parts located at the panel locations in the subset, the method further including:

automatically assigning the circuits in the wiring harness to the electrical contact locations.

8. The method of claim 7 wherein the step of assigning circuits in the wiring harnesses includes:

identifying a floating circuit for a first wiring harness;

determining a panel location for the floating circuit by looking up the panel location in the panel layout design for the vehicle;

selecting an electrical contact location associated with the panel location; and repeating the above steps for subsequent floating circuits in the first or subsequent wiring harnesses.

9. A computer readable medium on which is stored instructions for generating a control panel layout design for a vehicle panel, which then executed by a computer, performing the steps of:

reading a part list including a plurality of parts for a vehicle;

for each part in the list, automatically extracting panel location data including a part priority, a plurality of potential panel locations and associated panel location priorities corresponding to each part;

automatically determining a panel location for each part in order of the priority of each part including attempting to locate a current part at a first panel location of the corresponding potential panel locations for the current part, and if the first panel location is occupied, attempting to locate the current part at a second panel location of the corresponding panel locations for the part, and automatically repeating the attempts to locate the current part until a panel location is assigned or it is determined that none of the potential panel locations are available; and generating a panel layout design for the vehicle including a list of parts and corresponding panel location for each part.

10. The computer readable medium of claim 9 wherein the part list comprises a list of switches or gauges for a dash of a vehicle and the panel locations refer to footprints for the switches or gauges on the dash.

11. The computer readable medium of claim 9 wherein the part list comprises a list of electrical controls or connectors for an electrical panel in the vehicle.

12. The computer readable medium of claim 11 wherein the part list comprises a list of switches or gauges for instrument control panels in the vehicle and electrical connectors for an electrical panel in the vehicle.

13. The computer readable medium of claim 11 wherein each electrical connector has one or more electrical contact for electrically coupling a wire to the electrical connector; and further comprising instructions, which when executed by a computer, perform the following step:

assigning wires in vehicle wiring harnesses to the electrical contacts of the electrical connectors.

14. The computer readable medium of claim 9 further including instructions, which when executed by a computer, perform the steps of:

displaying an interactive user interface which enables a user to specify a part and corresponding panel locations for the part; and in response to input from the user specifying a part and corresponding potential panel locations, recording the part and the corresponding potential panel locations in a panel location table; and repetitively using the potential panel locations for the part to automatically locate the part in subsequent designs of panel layouts without requiring the user to re-enter panel location data for the part.

15. The computer readable medium of claim 9 further including instructions, which when executed by a computer, perform the step of:

automatically assigning circuits in wiring harnesses to electrical contact locations in the vehicle panel.

16. The computer readable medium of claim 15 wherein the step of assigning circuits in the wiring harnesses includes:

identifying a floating circuit for a first wiring harness;

determining a panel location for the floating circuit by looking up the panel location in the panel layout design for the vehicle;

selecting an electrical contact location associated with the panel location; and repeating the above steps for subsequent floating circuits in the first or subsequent wiring harnesses.

17. A computer implemented method for generating a panel layout and wiring harness specification for a vehicle comprising:

reading a part list including a plurality of parts for a vehicle;

for parts in the list, automatically extracting panel location data including a part priority, a plurality of potential panel locations and associated panel location priorities corresponding to each part;

automatically determining a panel location for a first part in order of the priority of each part including attempting to locate a current part at a first panel location of the corresponding potential panel locations for the current part, and if the first panel location is occupied, attempting to locate the current part at a second panel location of the corresponding panel locations for the part, and automatically repeating the attempts to locate the current part until a panel location is assigned or it is determined that none of the potential panel locations are available;

repeating the determining step for subsequent parts in the list;

generating a panel layout design for the vehicle including a list of parts and corresponding panel location for each part; and automatically assigning circuits in wiring harnesses to corresponding electrical contacts including:
 a) identifying a circuit for a first wiring harness,
 b) determining a panel location for the circuit by looking up the panel location in the panel layout design for the vehicle,
 c) selecting an electrical contact location associated with the panel location, and repeating steps a–c for subsequent circuits in the first or subsequent wiring harnesses to generate a wiring harness specification for the vehicle.

18. A computer implemented method for generating a control panel layout design for a vehicle panel comprising:

reading a part list including a plurality of parts for a vehicle;

for each part in the list, automatically extracting panel location data including a plurality of potential panel locations and associated panel location priorities corresponding to each part from the panel location database;

automatically determining a panel location for each part including attempting to locate a current part at a first panel location of the corresponding potential panel locations for the current part, and if the first panel location is occupied, attempting to locate the current part at a second panel location of the corresponding panel locations for the part, and automatically repeating the attempts to locate the current part until a panel location is assigned or it is determined that none of the potential panel locations are available;

generating a panel layout design for the vehicle including a list of parts and corresponding panel location for each part; and automatically assigning circuits in a wiring harness to electrical contact locations in a panel.

19. The method of claim 18 wherein the method of automatically assigning circuits includes determining a panel location of a first part, assigning a first circuit to a first electrical contact location associated with the panel location of the first part, and repeating the steps of determining the panel location and assigning a circuit to an electrical contact location associated with the panel location for subsequent circuits.

* * * * *

UNITED STATES PATENT AND TRADEMARK OFFICE
CERTIFICATE OF CORRECTION

PATENT NO. : 5,793,648
DATED : August 11, 1998
INVENTOR(S) : Nagle, et al

It is certified that error appears in the above-identified patent and that said Letters Patent is hereby corrected as shown below:

Column 6, line 57, "as a" should read --as--.

Column 9, line 27, "pin out" should read --pinout--.

Column 12, line 40, "in completes" should read --it completes--.

Column 13, line 4, "located" should read --locate--.

Column 13, line 53, "with the each" should read --with each--.

In the Claims:

Claim 9, line 64, "then" should read --when-- so the phrase reads "...which when executed by a computer, performing the steps of:"

Signed and Sealed this

Twenty-first Day of March, 2000

Attest:

Q. TODD DICKINSON

Attesting Officer

Commissioner of Patents and Trademarks